(12) United States Patent
Dribinsky et al.

(10) Patent No.: US 12,348,221 B2
(45) Date of Patent: *Jul. 1, 2025

(54) CIRCUIT AND METHOD FOR CONTROLLING CHARGE INJECTION IN RADIO FREQUENCY SWITCHES

(71) Applicant: pSemi Corporation, San Diego, CA (US)

(72) Inventors: Alexander Dribinsky, Naperville, IL (US); Tae Youn Kim, Irvine, CA (US); Dylan J. Kelly, San Diego, CA (US); Christopher N. Brindle, Poway, CA (US)

(73) Assignee: pSemi Corporation, San Diego, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/344,631

(22) Filed: Jun. 29, 2023

(65) Prior Publication Data
US 2024/0007098 A1    Jan. 4, 2024

Related U.S. Application Data

(63) Continuation of application No. 17/543,720, filed on Dec. 6, 2021, now Pat. No. 11,695,407, which is a (Continued)

(51) Int. Cl.
*H03K 17/16*     (2006.01)
*H03K 17/10*     (2006.01)
(Continued)

(52) U.S. Cl.
CPC ......... *H03K 17/161* (2013.01); *H03K 17/102* (2013.01); *H03K 17/284* (2013.01);
(Continued)

(58) Field of Classification Search
CPC ............. H01L 27/0288; H01L 27/0285; H01L 29/41725; H03K 17/102; H03K 17/284;
(Continued)

(56) References Cited

U.S. PATENT DOCUMENTS 4,317,055 A    2/1982  Yoshida et al.
5,095,348 A    3/1992  Houston
(Continued)

FOREIGN PATENT DOCUMENTS

JP    2003347553    12/2003

OTHER PUBLICATIONS

US 10,700,199 B2, 06/2020, Brindle (withdrawn)
(Continued)

*Primary Examiner* — Ryan Jager
(74) *Attorney, Agent, or Firm* — Haynes and Boone, LLP

(57) ABSTRACT

A circuit and method for controlling charge injection in a circuit are disclosed. In one embodiment, the circuit and method are employed in a semiconductor-on-insulator (SOI) Radio Frequency (RF) switch. In one embodiment, an SOI RF switch includes switching transistors coupled in series, referred to as "stacked" transistors, and implemented as a monolithic integrated circuit on an SOI substrate. Charge injection control elements are coupled to receive injected charge from resistively-isolated nodes located between the switching transistors, and to convey the injected charge to at least one node that is not resistively-isolated. The charge injection control elements include resistors or transistors. A method for controlling charge injection in a switch circuit is disclosed whereby injected charge is generated at resistively-isolated nodes between series coupled switching transistors, and the injected charge is conveyed to at least one node of the switch circuit that is not resistively-isolated.

20 Claims, 8 Drawing Sheets

300

Related U.S. Application Data continuation of application No. 16/921,790, filed on Jul. 6, 2020, now Pat. No. 11,196,414, which is a continuation of application No. 15/826,453, filed on Nov. 29, 2017, now Pat. No. 10,804,892, which is a continuation of application No. 14/987,360, filed on Jan. 4, 2016, now Pat. No. 9,887,695, which is a continuation of application No. 14/257,808, filed on Apr. 21, 2014, now Pat. No. 9,397,656, which is a continuation of application No. 11/881,816, filed on Jul. 26, 2007, now abandoned, which is a continuation-in-part of application No. 11/520,912, filed on Sep. 14, 2006, now Pat. No. 7,890,891, which is a continuation-in-part of application No. 11/484,370, filed on Jul. 10, 2006, now Pat. No. 7,910,993, said application No. 11/881,816 is a continuation-in-part of application No. 11/484,370, filed on Jul. 10, 2006.

(60) Provisional application No. 60/833,562, filed on Jul. 26, 2006, provisional application No. 60/718,260, filed on Sep. 15, 2005, provisional application No. 60/698,523, filed on Jul. 11, 2005.

(51) Int. Cl.
*H03K 17/284* (2006.01)
*H03K 17/687* (2006.01)
*H03K 17/689* (2006.01)
*H03K 17/04* (2006.01)
*H03K 17/06* (2006.01)
*H03K 17/08* (2006.01)

(52) U.S. Cl.
CPC ....... *H03K 17/6874* (2013.01); *H03K 17/689* (2013.01); *H03K 17/04* (2013.01); *H03K 17/06* (2013.01); *H03K 17/08* (2013.01); *H03K 2217/0009* (2013.01)

(58) Field of Classification Search
CPC ........... H03K 17/04106; H03K 17/164; H03K 17/6874
USPC ........................................................ 327/436
See application file for complete search history.

(56) References Cited

U.S. PATENT DOCUMENTS

| | | | |
|---|---|---|---|
| 5,587,604 A | 12/1996 | Machesney et al. | |
| 5,784,311 A | 7/1998 | Assaderaghi | |
| 5,818,099 A | 10/1998 | Burghartz | |
| 5,821,769 A | 10/1998 | Douseki | |
| 5,878,331 A | 3/1999 | Yamamoto | |
| 5,892,400 A | 4/1999 | Van Saders | |
| 5,930,638 A | 7/1999 | Reedy et al. | |
| 6,081,443 A | 6/2000 | Morishita | |
| 6,084,255 A | 7/2000 | Ueda | |
| 6,094,088 A | 7/2000 | Yano | |
| 6,100,564 A | 8/2000 | Bryant | |
| 6,111,778 A | 8/2000 | Macdonald | |
| 6,201,761 B1 | 3/2001 | Wollesen | |
| 6,218,890 B1* | 4/2001 | Yamaguchi | H01L 27/0605 327/431 |
| 6,281,737 B1 | 8/2001 | Kuang | |
| 6,341,087 B1 | 1/2002 | Kunikiyo | |
| 6,356,536 B1 | 3/2002 | Repke | |
| 6,486,511 B1 | 11/2002 | Nathanson | |
| 6,498,370 B1 | 12/2002 | Kim | |
| 6,519,191 B1 | 2/2003 | Morishita | |
| 6,521,959 B2 | 2/2003 | Kim | |
| 6,563,366 B1 | 5/2003 | Kohama | |
| 6,646,305 B2 | 11/2003 | Assaderaghi | |
| 6,696,680 B2* | 2/2004 | Wada | G06G 7/28 250/214 R |
| 6,730,953 B2* | 5/2004 | Brindle | H01L 27/0203 257/296 |
| 6,803,680 B2* | 10/2004 | Brindle | H01L 27/0629 307/115 |
| 6,804,502 B2 | 10/2004 | Burgener | |
| 6,836,172 B2 | 12/2004 | Okashita | |
| 6,987,414 B2* | 1/2006 | Numata | H01P 1/15 327/365 |
| 6,992,543 B2 | 1/2006 | Luetzelschwab et al. | |
| 7,106,121 B2* | 9/2006 | Hidaka | H03K 17/687 333/81 R |
| 7,345,521 B2* | 3/2008 | Takahashi | H04B 1/48 333/81 R |
| 7,405,982 B1 | 7/2008 | Flaker | |
| 7,459,988 B1 | 12/2008 | Iversen | |
| 7,692,514 B2* | 4/2010 | LeToux | H03K 17/6871 333/101 |
| 7,890,891 B2 | 2/2011 | Stuber et al. | |
| 7,910,993 B2 | 3/2011 | Brindle et al. | |
| 7,982,243 B1* | 7/2011 | Iversen | H01L 29/0692 257/202 |
| 8,008,988 B1 | 8/2011 | Yang et al. | |
| 8,129,787 B2 | 3/2012 | Brindle et al. | |
| 8,159,282 B2* | 4/2012 | Katoh | H03K 17/693 327/434 |
| 8,330,519 B2 | 12/2012 | Lam et al. | |
| 8,405,147 B2 | 3/2013 | Brindle et al. | |
| 8,461,903 B1* | 6/2013 | Granger-Jones | H03K 17/04123 327/427 |
| 8,742,502 B2 | 6/2014 | Brindle et al. | |
| 8,824,974 B2* | 9/2014 | Nakajima | H03K 17/005 455/127.1 |
| 9,087,899 B2 | 7/2015 | Brindle et al. | |
| 9,130,564 B2 | 9/2015 | Brindle et al. | |
| 9,397,656 B2 | 7/2016 | Dribinsky et al. | |
| 9,438,196 B2 | 9/2016 | Smith et al. | |
| 9,438,223 B2 | 9/2016 | De Jongh | |
| 9,467,124 B2 | 10/2016 | Crandall | |
| 9,608,619 B2 | 3/2017 | Stuber et al. | |
| 9,653,601 B2 | 5/2017 | Brindle et al. | |
| 9,780,775 B2 | 10/2017 | Brindle et al. | |
| 9,887,695 B2 | 2/2018 | Dribinsky et al. | |
| 9,948,281 B2* | 4/2018 | Ranta | H03J 3/16 |
| 10,074,746 B2 | 9/2018 | Brindle et al. | |
| 10,122,356 B2 | 11/2018 | Kunishi et al. | |
| 10,320,379 B2* | 6/2019 | Kerr | H04B 1/44 |
| 10,447,344 B2* | 10/2019 | Scott | H03K 17/693 |
| 10,608,623 B2* | 3/2020 | Kerr | H04B 1/44 |
| 10,622,990 B2 | 4/2020 | Brindle | |
| 10,622,993 B2 | 4/2020 | Burgener | |
| 10,680,600 B2 | 6/2020 | Brindle et al. | |
| 10,784,855 B2 | 9/2020 | Brindle | |
| 10,790,390 B2 | 9/2020 | Brindle | |
| 10,790,814 B2 | 9/2020 | Brindle | |
| 10,790,815 B2 | 9/2020 | Brindle | |
| 10,790,820 B2 | 9/2020 | Brindle | |
| 10,797,172 B2 | 10/2020 | Brindle | |
| 10,797,690 B2 | 10/2020 | Brindle | |
| 10,797,691 B1 | 10/2020 | Brindle | |
| 10,797,694 B2 | 10/2020 | Brindle | |
| 10,804,892 B2 | 10/2020 | Dribinsky et al. | |
| 10,812,068 B2 | 10/2020 | Brindle | |
| 10,818,796 B2 | 10/2020 | Stuber | |
| 11,011,633 B2 | 5/2021 | Brindle | |
| 11,196,414 B2 | 12/2021 | Dribinsky et al. | |
| 2001/0015461 A1 | 8/2001 | Ebina | |
| 2001/0045602 A1 | 11/2001 | Maeda | |
| 2002/0043691 A1 | 4/2002 | Higoshi | |
| 2002/0079971 A1 | 6/2002 | Vathulya | |
| 2003/0090313 A1* | 5/2003 | Burgener | H03K 17/063 327/408 |
| 2004/0004247 A1 | 1/2004 | Forbes | |
| 2004/0183588 A1 | 9/2004 | Chandrakasan et al. | |
| 2004/0207454 A1 | 10/2004 | Hidaka et al. | |
| 2004/0227565 A1 | 11/2004 | Chen | |

(56) References Cited

U.S. PATENT DOCUMENTS

| | | | |
|---|---|---|---|
| 2005/0072988 A1 | 4/2005 | Augusto | |
| 2005/0179093 A1 | 8/2005 | Morris | |
| 2006/0022526 A1 | 2/2006 | Cartalade | |
| 2006/0194567 A1 | 8/2006 | Kelly et al. | |
| 2007/0018247 A1 | 1/2007 | Brindle et al. | |
| 2007/0069291 A1 | 3/2007 | Stuber et al. | |
| 2007/0290744 A1 | 12/2007 | Adachi et al. | |
| 2008/0076371 A1* | 3/2008 | Dribinsky | H03K 17/6874 |
| | | | 455/208 |
| 2008/0265997 A1 | 10/2008 | Berroth et al. | |
| 2011/0002080 A1 | 1/2011 | Ranta | |
| 2011/0260780 A1 | 10/2011 | Granger-Jones et al. | |
| 2012/0267719 A1 | 10/2012 | Brindle et al. | |
| 2013/0009725 A1 | 1/2013 | Heaney et al. | |
| 2013/0278317 A1 | 10/2013 | Iversen et al. | |
| 2013/0288617 A1 | 10/2013 | Kim et al. | |
| 2013/0293283 A1 | 11/2013 | Jeon et al. | |
| 2014/0009248 A1 | 1/2014 | Granger-Jones | |
| 2014/0118053 A1 | 5/2014 | Matsuno | |
| 2014/0266415 A1 | 9/2014 | Kerr et al. | |
| 2015/0236691 A1 | 8/2015 | Cam et al. | |
| 2015/0381171 A1 | 12/2015 | Cebi et al. | |
| 2016/0020815 A1 | 1/2016 | Lee | |
| 2016/0056774 A1 | 2/2016 | Likov et al. | |
| 2016/0322385 A1* | 11/2016 | Fuh | H01L 25/0655 |
| 2016/0329891 A1 | 11/2016 | Bakalski et al. | |
| 2017/0012763 A1 | 1/2017 | Wu et al. | |
| 2017/0110451 A1 | 4/2017 | Fraser et al. | |
| 2017/0162692 A1 | 6/2017 | Brindle et al. | |
| 2017/0272066 A1 | 9/2017 | Scott et al. | |
| 2018/0091136 A1 | 3/2018 | Wang et al. | |
| 2018/0145678 A1 | 5/2018 | Maxim | |
| 2019/0237579 A1 | 8/2019 | Brindle | |
| 2019/0238126 A1 | 8/2019 | Brindle et al. | |
| 2020/0067504 A1 | 2/2020 | Brindle | |
| 2020/0076427 A1 | 3/2020 | Burgener | |
| 2020/0076428 A1 | 3/2020 | Burgener | |
| 2020/0112305 A1 | 4/2020 | Brindle | |
| 2020/0153430 A1 | 5/2020 | Burgener | |
| 2020/0295751 A1 | 9/2020 | Brindle | |
| 2020/0321467 A1 | 10/2020 | Brindle | |
| 2020/0335633 A1 | 10/2020 | Stuber | |
| 2021/0152170 A1 | 5/2021 | Dribinsky et al. | |
| 2021/0167773 A1 | 6/2021 | Burgener | |

OTHER PUBLICATIONS

US 10,700,200 B2, 06/2020, Brindle (withdrawn)

Willert-Porada—"Advances in Microwave and Radio Frequency Processing", 8th International Conference on Microwave and High-Frequency Heating, Oct. 2009, 408 pages, Doc 0714 (A-F).

RFMD's Petition for Inter Partes Review of U.S. Pat. No. 8,405,147 Under 35 U.S.C. 311 filed Mar. 27, 2014 in IPR2014-00546, 7810 pages, Doc 8086A-8086U.

RFMD's Corrected Petition for Inter Partes Review of U.S. Pat. No. 8,405,147 under 35 U.S.C. 311 filed Apr. 14, 2014 in IPR2014-00546, 64 pages, Doc 8087.

RFMD's Corrected Petition for Inter Partes Review of U.S. Pat. No. 8,405,147 under 35 U.S.C. 311 (Redline Copy) filed Apr. 14, 2014 in IPR2014-00546, 68 pages, Doc 8088.

Peregrine's Patent Owner Preliminary Response Pursuant to 37 C.F.R. 42.107 filed Jul. 10, 2014 in IPR2014-00546, 101 pages, Doc 8089.

RF Micro Devices Inc., Invalidity Contentions for US Pat. No. 8,405,147, Dec. 10, 2013 (Civil Case#: 3:12-cv-00911-H-JLB), 324 pages, Doc8000.

RF Micro Devices Inc., Invalidity Contentions for U.S. Pat. No. 7,910,993, Dec. 10, 2013 (Civil Case#: 3:12-cv-00911-H-JLB), 1697 pages, Doc 8001.

RF Micro Devices Inc., Exhibit listing prior art identified in connection with Invalidity Contentions for U.S. Pat. No. 7,910,993 and U.S. Pat. No. 8,405,147, Dec. 10, 2013, (Civil Case#: 3:12-cv-00911-H-JLB), 21 pages, Doc 8004.

RF Micro Devices Inc., Amended Invalidity Contentions for U.S. Pat. No. 8,405,147, Dec. 10, 2013 (Civil Case#: 3:12-cv-00911-H-JLB), 362 pages, Doc 8006.

RF Micro Devices Inc., Amended Invalidity Contentions for U.S. Pat. No. 7,910,993, Dec. 10, 2013 (Civil Case#: 3:12-cv-00911-H-JLB), 110 pages, Doc8007.

RF Micro Devices Inc., Amended Exhibit listing prior art identified in connection with Invalidity Contentions for U.S. Pat. No. 7,910,993 and US Patent 8,405, 147, Dec. 10, 2013, (Civil Case#: 3:12-cv-00911-H-JLB), 33 pages, Doc 8005.

RF Micro Devices Inc., Invalidity Contentions for U.S. Pat. No. 7,860,499, Dec. 10, 2013 (Civil Case#: 3:12-cv-00911-H-JLB), 403 pages, Doc 8002.

RF Micro Devices Inc., Invalidity Contentions for U.S. Pat. No. 7,123,898, Dec. 10, 2013 (Civil Case#: 3:12-cv-00911-H-JLB), 383 pages, Doc 8003.

RF Micro Devices Inc., Amended Invalidity Contentions for U.S. Pat. No. 7,860,499, Dec. 10, 2013 (Civil Case#: 3:12-cv-00911-H-JLB), 445 pages, Doc 8008.

RF Micro Devices Inc., Amended Invalidity Contentions for U.S. Pat. No. 7,123,898, Dec. 10, 2013 (Civil Case#: 3:12-cv-00911-H-JLB), 430 pages, Doc 8009.

RF Micro Devices Inc., Invalidity Contentions for U.S. Pat. No. 7,860,499, Dec. 10, 2013 (Civil Case#: 3:12-cv-00911-H-JLB), 403 pages, Doc 8010.

RF Micro Devices Inc., Invalidity Contentions for U.S. Pat. No. 7,123,898, Dec. 10, 2013 (Civil Case#: 3:12-cv-00911-H-JLB), 383 pages, Doc 8011.

RF Micro Devices Inc., Amended Invalidity Contentions for U.S. Pat. No. 7,860,499, Dec. 10, 2013 (Civil Case#: 3:12-cv-00911-H-JLB), 445 pages, Doc 8012.

RF Micro Devices Inc., Amended Invalidity Contentions for U.S. Pat. No. 7,123,898, Dec. 10, 2013 (Civil Case#: 3:12-cv-00911-H-JLB), 504 pages, Doc 8013.

Docket for Case No. CACD-8-12-cv-00248 filed Feb. 14, 2012 in the United States District Court, Central District of California, Southern Division, 4 pages, Doc 8022.

Docket for Case 377-TA-848 filed Feb. 14, 2012 in the International Trade Commission, 14 pages, Doc 8023.

Docket for Case No. CASD-3-12-cv-00911 filed Feb. 13, 2012 in the United States District Court, Central District of California, Southern Division, 42 pages, Doc 8024.

Docket for Case No. CASD-3-12-cv-01160 filed May 11, 2012 in the United States District Court, Central District of California, Southern Division, 10 pages, Doc 8025.

Docket for Case No. CASD-3-13-cv-00725 filed Mar. 26, 2013 in the United States District Court, Central District of California, Southern Division, 4 pages, Doc 8026.

Docket for Case No. NCMD-1-12-cv-00377 filed Apr. 16, 2012 in the United States District Court, North Carolina Middle District, 5 pages, Doc8027.

Peregrine's Verified Complaint filed with ITC Feb. 14, 2012 in 337-TA-848, 39 pages, Doc 8067.

Peregrine's Letter to Supplement Feb. 14, 2012 Complaint filed Feb. 16, 2012 in 337-TA-848, 1 page, Doc 8080.

Peregrine's Letter to Clarify and Supplement Feb. 14, 2012 Complaint filed Feb. 28, 2012 in 337-TA-848, 1 page, Doc 8081.

Peregrine's First Amended Complaint filed May 11, 2012 in 337-TA-848, 38 pages, Doc 8068.

Peregrine's Errata to Correct Typographical Error in Peregrine's First Amended Complaint filed May 15, 2012 in 337-TA-848, 2 pages, Doc 8071.

HTC's Response to First Amended Complaint filed Jul. 2, 2012 in 337-TA-848, 22 pages, Doc 8070.

Motorola's Exhibit A to the Response to Amended Complaint filed Jul. 2, 2012 in 337-TA- 848, 3 pages, Doc 8073.

Motorola's Response to Amended Complaint filed Jul. 2, 2012 in 337-TA-848, 24 pages, Doc 8074.

RFMD's Response to First Amended Complaint filed Jul. 2, 2012 in 337-TA-848, 26 pages, Doc 8078.

(56) References Cited

OTHER PUBLICATIONS

HTC's Response to Amended Complaint filed Jul. 3, 2012 in 337-TA-848, 3 pages, Doc 8069.
Peregrine's Appendices A and I to Accompany First Amended Complaint filed Jul. 3, 2012 in 337-TA-848, 2 pages, Doc 8076.
Peregrine's Motion for Leave to Amend Complaint filed Jul. 20, 2012 in 337-TA-848, 87 pages, Doc 8077.
Peregrine's Letter to Supplement First Amended Complaint filed Jul. 25, 2012 in 337-TA- 848, 3 pages, Doc 8072.
Peregrine's Notice of Patent Priority Dates filed Aug. 22, 2012 in 337-TA-848, 4 pages, Doc 8075.
Commission Investigative Staffs Notice of Prior Art filed Aug. 31, 2012 in 337-TA-848, 3 pages, Doc 8079.
Peregrine's Complaint for Damages and Injunctive Relief filed Feb. 14, 2012 in CACD-8-12-cv-00248, 101 pages, Doc 8082.
Peregrine's Complaint for Injunctive Relief filed Apr. 13, 2012 in CASD-3-12-cv-00911, 199 pages, Doc 8030.
RFMD and Motorola's Answer to Complaint and RFMD's Counterclaim filed Jun. 8, 2012 in CASD-3-12-cv-00911, 18 pages, Doc8031.
RFMD's Answer, Defenses and Counterclaims to Plaintiff's Complaint filed May 1, 2013 in CASD-3-12-cv-00911, 11 pages, Doc8032.
Peregrine's Answer to RFMD's Counterclaims filed May 28, 2013 in CASD-3-12-cv-00911, 10 pages, Doc 8033.
Peregrine's First Amended Complaint filed 11/21/22013 in CASD-3-12-cv-00911, 348 pages, Doc 8035.
Peregrine's Motion for Preliminary Injunction filed Nov. 25, 2013 in CASD-3-12-cv-00911, 327 pages, Doc 8036.
RFMD's Amended Answer, Defenses and Counterclaims to Plaintiff's Complaint (Redacted Public Version) filed Dec. 12, 2013 in CASD-3-12-cv-00911, 65 pages, Doc 8034.
Defendant RFMD's Opposition to Peregrine's Motion for Preliminary Injunction filed Dec. 13, 2013 in CASD-3-12-cv-00911, 504 pages, Docs 8028A - 8028D.
Peregrine's Reply in Support of Its Motion for Preliminary Injunction (Public Redacted Version) filed Dec. 20, 2013 in CASD-3-12-cv-00911, 130 pages, Doc 8037.
RFMD's Unopposed Motion for Leave to File Short Surreply in Opposition to Peregrine's Motion for Preliminary Injunction filed Jan. 3, 2014 in CASD-3-12-cv-00911, 60 pages, Doc 8038.
Peregrine's Unopposed Motion for Leave to File Response to RFMD's Surreply filed Jan. 3, 2014 in CASD-3-12-cv-00911, 15 pages, Doc 8039.
Peregrine's Answer and Counterclaims to RFMD's Counterclaims filed Jan. 6, 2014 in CASD-3-12-cv-00911, 23 pages, Doc 8040.
Order Denying Peregrine's Motion for Preliminary Injunction filed Jan. 8, 2014 in CASD-3-12-cv-00911, 7 pages, Doc 8041.
RFMD's Answer to Peregrine's Counterclaims filed Jan. 27, 2014 in CASD-3-12-cv-00911, 5 pages, Doc 8042.
RFMD's Motion to Dismiss Peregrine's 3rd, 4th, 6th, 7th and 8th Counts for Lack of Subject Matter Jurisdiction filed Jan. 30, 2014 in CASD-3-12-cv-00911, 323 pages, Doc 8043.
Defendant Benton's Answer and Defenses to Plaintiffs First Amended Complaint filed Jan. 31, 2014 in CASD-3-12-cv-00911, 36 pages, Doc 8044.
Joint Claim Construction and Prehearing Statement Pursuant to Patent L.R. 4.2 filed Feb. 4, 2014 in CASD-3-12-cv-00911, 176 pages, Doc 8045.
Defendant Benton's Notice of Joinder to RFMD's Motion to Dismiss and Motion and Memorandum in Support of Motion to Dismiss Peregrine's 1st, 2nd, and 3rd Causes of Action for Lack of Subject Matter Jurisdiction filed Feb. 26, 2014 in CASD-3-12-cv-00911, 13 pages, Doc 8046.
Peregrine's Memorandum in Opposition to RFMD's Motion to Dismiss filed Mar. 3, 2014 in CASD-3-12-cv-00911, 184 pages, Doc 8047.
Peregrine's Opening Claim Construction Brief filed Mar. 4, 2014 in CASD-3-12-cv-00911, 377 pages, Docs 8029A and 80298.

RFMD's Opening Brief on Claim Construction (Public Redacted Version) filed Mar. 4, 2014 in CASD-3-12-cv-00911, 27 pages, Doc8048.
RFMD's Declaration of Mark Tung in Support of RFMD's Opening Claim Construction Brief filed Mar. 4, 2014 in CASD-3-12-cv-00911, 162 pages, Doc 8049.
RFMD's Reply Memorandum in Support of Its Motion to Dismiss Peregrine's 4th, 6th, 7th and 8th Counts for Lack of Subject Matter Jurisdiction filed Mar. 10, 2014 in CASD-3- 12-cv-00911, 37 pages, Doc 8051.
Peregrine's Memorandum in Opposition to Benton's Motion to Dismiss (Public Redacted Version) filed Mar. 14, 2014 in CASD-3-12-cv-00911, 86 pages, Doc 8052.
Order (1) Granting in Part and Denying in Part RFMD's Motion to Dismiss; (2) Granting Benton's Motion to Dismiss; and (3) Denying Peregrine's Motion to Stay filed Mar. 18, 2014 in CASD-3-12-cv-00911, 10 pages, Doc 8053.
Stricken Document: Response to Claim Construction Brief Pursuant to Order 214 filed Mar. 18, 2014 in CASD-3-12-cv-00911, 1 page, Doc 8054.
RFMD's Responsive Brief on Claim Construction filed Mar. 18, 2014 in CASD-3-12-cv-00911, 36 pages, Doc 8055.
Order Striking Peregrine's Mar. 18, 2014 Filings and Granting Peregrine's Motion to File Responsive Claim Construction Brief filed Mar. 20, 2014 in CASD-3-12-cv-00911, 2 pages, Doc 8056.
Peregrine's Substitute Responsive Claim Construction Brief (Public Redacted Version) filed Mar. 24, 2014 in CASD-3-12-cv-00911, 20 pages, Doc 8057.
Peregrine's Opening Claim Construction Brief for U.S. Pat. No. 6,903,426 filed Apr. 4, 2014 in CASD-3-12-cv-00911, 149 pages, Doc 8058.
RFMD's Opening Brief on Claim Construction for U.S. Pat. No. 6,903,426 filed Apr. 4, 2014 in CASD-3-12-cv-00911, 148 pages, Doc 8059.
Peregrine's Responsive Claim Construction Brief for U.S. Pat. No. 6,903,426 filed Apr. 11, 2014 in CASD-3-12-cv-00911,31 pages, Doc 8060.
RFMD's Responsive Brief on Claim Construction filed Apr. 11, 2014 in CASD-3-12-cv- 00911, 79 pages, Doc 8061.
Tentative Claim Construction Order for U.S. Pat. No. 7,910,993, 8,405,147 and 6,903,426 filed Apr. 16, 2014 in CASD-3-12-cv-00911, 87 pages, Doc 8062.
Peregrine's Markman Hearing Slide Deck filed Apr. 18, 2014 in CASD-3-12-cv-00911,62 pages, Doc 8063.
RFMD's Markman Hearing Slide Deck filed Apr. 18, 2014 in CASD-3-12-cv-00911, 36 pages, Doc 8064.
Claim Construction Order for U.S. Pat. No. 7,910,993, 8,405,147 and6,903,426 filed Apr. 23, 2014 in CASD-3-12-cv-00911, 16 pages, Doc 8065.
Claim Construction Charts for U.S. Pat. No. 7,910,993, 8,405,147 and6,903,426 filed Apr. 23, 2014 in CASD-3-12-cv-00911, 72 pages, Doc 8066.
Declaration of Brian Floyd, Ph.D. filed 3/'- 12016 1n CASD-3-12-cv-00911, 23 pages, Doc 8050.
Peregrine's Complaint for Damages and Injunctive Relief filed May 11, 2012 in CASD-3-12-cv-01160, 9 pages, Doc 8083.
Peregrine's Complaint and Demand for Jury Trial filed Mar. 26, 2013 in CASD-3-13-cv-00725, 68 pAGES, 68 pages, Doc 8084.
RFMD's Complaint for Declaratory Judgment of Patent Non-Infringement and Invalidity filed Apr. 16, 2012 in NCMD-1-12-cv-00377, 246 pages, Doc 8085.
Voldman—"Dynamic Threshold Body- and Gate-coupled SOI ESD Protection Networks", Journal of Electrostatics 44, Mar. 20, 1998, pp. 239-255, Doc 8015.
Matloubian—"Smart Body Contact for SOI MOSFETs" 1989 IEEE SOS/SOI Technology Conference pp. 128-129, Oct. 3-5, 1989, 2 pages, Doc 0425.
Hieda—Floating-Body Effect Free Concave SOI-MOSFETs (COS-MOS), ULSI Research Center, Toshiba Corporation, IEEE 1991, pp. 26.2.1-26.2.4, Dec. 8-11, 1991, 4 pages, Doc 0187.
Patel—"A Novel Body Contact for SIMOX Based SOI MOSFETs", Solid-State Electronics vol. 34, No. 10, pp. 1071-1075, Apr. 22, 1991, 6 pages, Doc 3000.

(56) References Cited

OTHER PUBLICATIONS

Katzin—"High Speed 100+ W RF Switched Using GaAs MMICs", IEEE Transactions on Microwave Theory and Techniques, Nov. 1992, pp. 1989-1996, 8 pages, Doc 0194.
Armijos—"High Speed DMOS FET Analog Switches and Switch Arrays", Temic Semiconductors Jun. 22, 1994, pp. 1-10, 10 pages, Doc 0202.
Li—"Suppression of Geometric Component of Charge Pumping Current SOI/MOSFETs", Proc. Int. Symp. VLSI Technology, Systems & Applications (IEEE May 31-Jun. 2, 1995), pp. 144-148, 5 pages, Doc 8016.
Chan—"A Novel SOI CBiCMOS Compatible Device Structure for Analog and Mixed-Mode Circuits", Dept. of EECS, University of California at Berkeley, IEEE Nov. 1995, pp. 40-43, 4 pages, Doc 1078.
Kohama—"High Power DPDT Antenna Switch MMIC for Digital Cellular Services", IEEE Journal of Solid-State Circuits, Oct. 1996, pp. 1406-1411, 6 pages, Doc 0244.
Tenbroek—"Electrical Measure of Silicon Film and Oxide Thickness in Partially Depleted SOI Technologies", Solid-State Electronics, vol. 39, No. 7, pp. 1011-1014, Nov. 14, 1995,4pages, Doc8019.
NEC Corporation—"uPG13xG Series L-Band SPOT Switch GaAs MMIC", Document No. P1096EJ1VOANDO (1st Edition), Feb. 1996, 30 pages, Doc 0248.
Kuge—"SOI-DRAM Circuit Technologies for Low Power High Speed Multigiga Scale Memories", Jun. 8-10, 1995, IEEE Journal of Solid-State Circuits, vol. 31, No. 4, Apr. 1996, pp. 586-591, 6 pages, Doc 0259.
Fung—"Frequency Dispersion in Partially Depleted SOI MOSFET Output Resistance", Proceedings 1996 IEEE International SOI Conference, Oct. 1996, pp. 146-147, 2 pages, Doc 0268.
Yamamoto—"A Single-Chip GaAs RF Transceiver for 1.9GHz Digital Mobile Communication Systems", IEEE Dec. 1996, pp. 1964-1973, 10 pages, Doc 0255.
Johnson—"Silicon-On-Sapphire Technology for Microwave Circuit Applications", Dissertation UCSD Jan. 1997, IEEE May 1998, pp. 1-184, 214 pages, Doc 0288.
Koh—"1Giga Bit SOI DRAM with Fully Bulk Compatible Process and Body-Contacted SOI MOSFET Structure", IEEE Dec. 10, 1997, pages, Doc 8021.
Maeda—"A Highly Reliable .35um Field Body-Tied SOI Gate Array for Substrate-Bias-Effect Free Operation", 1997 Symposium on VLSI Technology Digest of Technical Papers, Jun. 10-12, 1997, 2 pages, Doc 8020.
Koh—"Body-ContactedSOI MOSFET Structure with Fully Bulk CMOS Compatible Layout and Process", IEEE Electron Device Letters, vol. 18, No. 3, Mar. 1997, pp. 102-104, 3 pages, Doc 0305.
Huang—"Device Physics, Performance Simulations and Measured Results of SOI MOS and DTMOS Transistors and Integrated Circuits", Beijing Microelectronics Technology Institute, Oct. 23, 1998 IEEE, pp. 712-715, 4 pages, Doc 0333.
Hirota—"0.5V 320MHz 8b Multiplexer/Demultiplier Chips Based on a Gate Array with Regular-Structured DRMOS/SOI", Feb. 5-7, 1998, 1998 IEEE International Solid-State Circuits Conference. Digest of Technical Papers, ISSCC. First Edition, pp. 12.2-1-12.2-11, 11 pages, Doc0351.
Chuang—"SOI for Digital Cmos Vlsi Design: Design Considerations and Advances", Proceedings of the IEEE vol. 86, No. 4, Apr. 1, 1998 pp. 689-720, 32 pages, Doc 1079.
Duyet—"Suppression of Geometric Component of Charge Pumping Current in Thin Film Silicon on insulator Metal-Oxide-Semiconductor Field-Effect Transistors", Japanese Journal of Applied Physics, Jul. 15, 1998, vol. 37, pp. L855-858, 4 pages, Doc 0729.
Gil—"A High Speed and Low Power SOI Inverter using Active Body-Bias", Proceedings International Symposium on Low Power Electronics and Design, Sep. 1998, pp. 59-63, 5 pages, Doc 0359.
Tseng—"AC Floating-Body Effects an Submicron Fully Depleted (FS) SOI nMOSFETs and the Impact on Analog Applications", IEEE Electron Devices, vol. 19, No. 9, Sep. 1998, pp. 351-353, 3 pages, Doc0362.
Duyet—"Effects of Body Reverse Pulse Bias on Geometric Component of Charge Pumping Current in FD SOI MOSFETs", Proceedings IEEE Intl SOI Conference, Oct. 5-8, 1998, pp. 79-80, 2 pages, Doc 0364.
Chung—"A New SOI MOSFET Structure with Junction Type Body Contact", International Electron Device Meeting (IEDM) Technical Digest, Dec. 5-8, 1999, pp. 59-62, 4 pages, Doc 0379.
Devlin—"The Design of Integrated Switches and Phase Shifters", Nov. 24, 1999, 15 pages, Doc 0381.
Lim—"Partial SOI LDMOSFETs for High-Side Switching", Dept. of Engineering, University of Cambridge, Oct. 5-9, 1999 IEEE, pp. 149-152, 4 pages, Doc 0393.
Maeda—"Substrate Bias Effect and Source Drain Breakdown Characteristics in Body Tied Short Channel SOI MOSFETs", IEEE Transactions on Electron Devices, vol. 46, No. 1, Jan. 1999, pp. 151-158, 8 pages, Doc 0397.
Rodgers—"Silicon UTSi CMOS RFIC for CDMA Wireless Communications System", IEEE MTT-S Digest, Jun. 14-15, 1999, pp. 485-488, 4 pages, Doc 0406.
Yamamoto—"A 2.2-V Operation, 2.4-GHz Single-Chip GaAs MMIC Transceiver for Wireless Applications", IEEE Journal of Solid-State Circuits, vol. 34, No. 4, Apr. 1999, pp. 502-512, 11 pages, Doc 0417.
Chen—"Low Power, Multi-Gigabit DRAM Cell Design Issues Using SOI Technologies", http://bwrc.eecs.berkeley.edu/people/grad_students/chenff/reports, May 14, 1999, 6 pages, Doc 0418.
Allen—"Characterization and Modeling of Silicon-on-Insulator Field Effect Transistors", Department of Electrical Engineering and Computer Science, MIT May 20, 1999, 80 pages, Doc 0419.
Tseng—"AC Floating-Body Effects and the Resultant Analog Circuit Issues in Submicron Floating Body and Body-Grounded SOI MOSFETs", IEEE Transactions on Electron Devices, vol. 46, No. 8, Aug. 1999, 8 pages, Doc 0420.
Fung—"Controlling Floating-Body Effects for 0.13um and .10um SOI CMOS", IDEM 00-231-234, Dec. 10-13, 2000, IEEE, 4 pages, Doc 8017.
Imam—"A Simple Method to Determine the Floating-Body Voltage of SOI CMOS Devices", IEEE Electron Device Letters, vol. 21, No. 1, Jan. 2000, pp. 21-23, 3 pages, Doc 0441.
Kanda—"A Si RF Switch MMIC for the Cellular Frequency Band Using SOI-CMOS Technology", The Institute of Electronics, Information and Communication Engineers, vol. 100, No. 152, Jun. 2000, pp. 79-83, 5 pages, Doc 0443.
Shahid!—"Issues in SOI CMOS Technology and Design", IEEE 2000 Custom Integrated Circuits Conference, Publication/Presentation dated May 21, 2000, 78 pages, Doc 8014.
Horiuchi—"A Dynamic-Threshold SOI Device with a J-FET Embedded Source Structure and a Merged Body-Bias-Control Transistor—Part II: Circuit Simulation", IEEE Transactions on Electron Devices, vol. 47, No. 8, Aug. 2000, pp. 1593-1598, 6 pages, Doc 0457.
Horiuchi—"A Dynamic-Threshold SOI Device with a J-FET Embedded Source Structure and a Merged Body-Bias-Control Transistor—Part I: a J-FETt Embedded Source Structure Properties", IEEE Transactions on Electron Devices, vol. 47, No. 8, Aug. 2000, pp. 1587-1592, 6 pages, Doc 0456.
Scheinberg—"A Computer Simulation Model for Simulating Distortion in FET Resistors", IEEE Transactions on Computer-Aided Design of Integrated Circuits and Systems, vol. 19, No. 9, Sep. 2000, pp. 981-989, 9 pages, Doc 0461.
Cristoloveanu—"The Four-Gate Transistor", Institute of Microelectronics, Electromagnetism and Photonics, ESSDERC Sep. 24-26, 2002, pp. 323-326, 4 pages, Doc 0478.
Reedy—"Utsi CMOS: A Complete RF SOI Solution", Peregrine Semiconductor Nov. 2000, pp. 1-6, 6 pages, Doc 0508.
Yamamoto—"A 2.4GHz Band 1.8V Operation Single Chip SI-CMOS T/R MMIC Front End with a Low Insertion Loss Switch", IEEE Journal of Solid-State Circuits, vol. 36, No. 8, Aug. 2001, pp. 1186-1197, 12 pages, Doc0527.
Adan—"OFF-State Leakage Current Mechanisms in BulkSi and SOI MOSFETs and Their Impact on CMOS ULSIs Standby Current", IEEE Transactions on Electron Devices, vol. 48, No. 9, Sep. 2001, pp. 2050-2057, 8 pages, Doc 0528.

(56) References Cited

OTHER PUBLICATIONS

Goldman—"0.15um SOI DRAM Technology Incorporating Sub-Volt Dynamic Threshold Devices for Embedded Mixed-Signal & RF Circuits", Oct. 1-4, 2001 IEEE SOI Conference, pp. 97-98, 2 pages, Doc 0531.
Fung—"Present Status and Future Direction of BSIM SOIL Model for High-Performance/Low-Power/RF Application", IBM Microelectronics, Semiconductor Research and Development Center, Apr. 2002, 4 pages, Doc 0554.
Adan—"Linearity and Low-Noise Performance of SOI MOSFETs for RF Applications", IEEE Transactions on Electron Devices, May 2002 Vol. 49, No. 5, pp. 881-888, 8 pages, Doc 0555.
Akarvardar—"Multi-Bias Dependence of Threshold Voltage, Sub-threshold Swing, and Mobility in G4-FETs", Institute of Microelectronics, Electromagnetism, and Photonics, IEEE Oct. 2003, pp. 127-130, 4 pages, Doc 1075.
Dufrene—"The G4-FET: Low Voltage to High Voltage Operation and Performance", Dept. of Electrical and Computer Engineering, The University of Tennessee, IEEE Jan. 2003, pp. 55-56, 2 pages, Doc 0565.
Marks—"SOI for Frequency Synthesis in RF Integrated Circuits", Thesis submitted to North Carolina State University, May 2003, 155 pages, Doc 0574.
Zhu Ming—"A New Structure of Silicon-on-Insulator Metal-Oxide Semiconductor Field Effect Transistor to Suppress the Floating Body Effect", Nov. 4, 2002, Chin. Phys. Lett., vol. 20, No. 5 (2003) pp. 767-769, 3 pages, Doc 0575.
Fung—"On the Body-Source Built-In Potential Lowering of SOI MOSFETS", IEEE Electron Device Letters, vol. 24, No. 2, Feb. 2003, pages, Doc 8018.
Tinella—"Study of the Potential of CMOS-SOI Technologies Partially Abandoned for Radiofrequency Applications", Thesis for obtaining the standard of Doctor of INPG, National Polytechnic of Grenoble, Sep. 25, 2003, 187 pages, Doc 0594.
De Houck—"Design of EEPROM Memory Cells in Fully Depleted 'CMOS SOI Technology", Universite Catholique de Louvain Faculty of Applied Science, Laboratory of Electronics and Microelectronics, Academic Year 2003-2004, Jan. 2003, 94 pages, Doc 0599.
Streetman—"Solid State Electronic Devices", Microelectronics Research Center, Dept. of Electrical and Computer Engineering, The University of Texas at Austin, Chapter 6, Jan. 2004 by Pearson Education Inc., 4 pages, Doc 0602.
Zhu—"Simulation of Suppression of Floating-Body Effect in Partially Depleted SOI MOSFET Using a Sil-xGex Dual Source Structure", Materials Science and Engineering B 114-115 Dec. 15, 2004, pp. 264-268, 5 pages, Doc 0604.
Chen—"G4-FET Based Voltage Reference", Masters Theses, University of Tennessee, Knoxville, Trace: Tennessee Research and Creative Exchange, May 2004, 57 pages, Doc 0607.
Ippoushi—"SOI Structure Avoids Increases in Chip Area and Parasitic Capacitance Enables Operational Control of Transistor Threshold Voltage", Renesas Edge, vol. 2004.Jul. 5, 2004, p. 15, 1 page, Doc 0610.
Akarvardar—"Threshold Voltage Model of the SOI 4-Gate Transistor", 2004 IEEE International SOI Conference, Oct. 4-7, 2004, pp. 89-90, 2 pages, Doc 0613.
Dufrene—"Investigation of the Four-Gate Action in G4-FETs", IEEE Transactions on Electron Devices, vol. 51, No. 11, Dec. 2004, pp. 1931-1935, 5 pages, Doc 0617.
Cathelin—"Antenna Switch Devices in RF Modules for Mobile Applications", ST Microelectronics, Front-End Technology Manufacturing, Crolles, France, Mar. 2005, 42 pages, Doc 0623.

* cited by examiner

US 12,348,221 B2

CIRCUIT AND METHOD FOR CONTROLLING CHARGE INJECTION IN RADIO FREQUENCY SWITCHES

CROSS-REFERENCE TO RELATED UTILITY AND PROVISIONAL APPLICATIONS—CLAIMS OF PRIORITY

This patent application is a continuation of U.S. patent application Ser. No. 17/543,720, filed Dec. 6, 2021 and entitled "Circuit And Method For Controlling Charge Injection In Radio Frequency Switches". U.S. patent application Ser. No. 17/543,720 is a continuation of U.S. patent application Ser. No. 16/921,790, filed Jul. 6, 2020 and entitled "Circuit And Method For Controlling Charge Injection In Radio Frequency Switches". U.S. patent application Ser. No. 16/921,790 is a continuation of U.S. patent application Ser. No. 15/826,453, filed Nov. 29, 2017 and entitled "Circuit And Method For Controlling Charge Injection In Radio Frequency Switches". U.S. patent application Ser. No. 15/826,453 is continuation of U.S. patent application Ser. No. 14/987,360, filed Jan. 4, 2016 and entitled "Circuit And Method For Controlling Charge Injection In Radio Frequency Switches". U.S. patent application Ser. No. 14/987,360 is continuation of U.S. patent application Ser. No. 14/257,808, filed Apr. 21, 2014 and entitled "Circuit And Method For Controlling Charge Injection In Radio Frequency Switches". U.S. patent application Ser. No. 14/257,808 is continuation of U.S. patent application Ser. No. 11/881,816, filed Jul. 26, 2007 and entitled "Circuit And Method For Controlling Charge Injection In Radio Frequency Switches". U.S. patent application Ser. No. 11/881,816 is a continuation-in-part of U.S. patent application Ser. No. 11/520,912, filed Sep. 14, 2006 and entitled "Method And Apparatus Improving Gate Oxide Reliability by Controlling Accumulated Charge". U.S. patent application Ser. No. 11/520,912 claims priority to and the benefit of U.S. Provisional Patent Application No. 60/718,260, filed Sep. 15, 2005 and entitled "Method And Apparatus Improving Gate Oxide Reliability By Controlling Accumulated Charge". U.S. patent application Ser. No. 11/520,912 is a continuation-in-part of U.S. patent application Ser. No. 11/484,370, filed Jul. 10, 2006 and entitled "Method And Apparatus For Use In Improving Linearity of Mosfet's Using An Accumulated Charge Sink". U.S. patent application Ser. No. 11/484,370 claims priority to and benefit of U.S. Provisional Patent Application No. 60/698,523, filed Jul. 11, 2005, and entitled "Method And Apparatus For Use In Improving Linearity Of Mosfet's Using An Accumulated Charge Sink". U.S. patent application Ser. No. 11/881,816 is a continuation-in-part of U.S. patent application Ser. No. 11/484,370, filed Jul. 10, 2006, and entitled "Method And Apparatus For Use In Improving Linearity of Mosfet's Using An Accumulated Charge Sink". U.S. patent application Ser. No. 11/881,816 claims priority to and the benefit of U.S. Provisional Patent Application No. 60/833,562, filed Jul. 26, 2006 and entitled "Circuit And Method For Controlling Charge Injection In Radio Frequency Switches". All of the above patent applications are incorporated herein by reference in their entirety.

BACKGROUND

1. Field

The present teachings relate to electronic switches, and particularly to a circuit and method for controlling charge injection in semiconductor-on-insulator (SOI) radio frequency (RF) switches.

2. Description of Related Art

Radio frequency (RF) switches for directing RF signals are found in many different RF devices such as televisions, video recorders, cable television equipment, cellular telephones, wireless pagers, wireless infrastructure equipment, and satellite communications equipment. As is well known, the performance of RF switches is controlled by three primary operating performance parameters: insertion loss, switch isolation, and the "1 dB compression point." The "1 dB compression point" is related to, and is indicative of, the linearity performance of an RF switch. Linearity performance is also indicated by the levels of RF signal harmonics generated by an RF switch, particularly at high RF power levels. These three performance parameters are tightly coupled, and any one parameter can be emphasized in the design of RF switch components at the expense of others. A fourth performance parameter that is occasionally considered in the design of RF switches is commonly referred to as the switching time or switching speed (defined as the time required to turn one side of a switch on and turn the other side off). Other characteristics important in RF switch design include ease and degree (or level) of integration of the RF switch, complexity, yield, return loss and cost of manufacture.

Charge injection is a problem that may occur in switching circuits such as SOI RF switches. Charge injection occurs when an applied voltage, such as a gate bias voltage, is connected to a "resistively-isolated node" through a coupling capacitance. A resistively-isolated node is defined herein as a node that at some interval during operation is connected to other circuit elements only through very high resistance connections. For example, a resistively-isolated node may occur at a transistor channel node located between series-connected transistors when the transistors are in an OFF-state. The coupling capacitance through which charge injection occurs may be either a parasitic capacitance of a circuit element (e.g., gate-to-source capacitance in a transistor), or a capacitance associated with a capacitor. For example, a bias voltage applied to the gate of a transistor may be connected to a resistively-isolated source node of the transistor through the gate-to-source capacitance. In general, charge injection may be a problem for many types of switching circuits. In particular, charge injection is significantly deleterious to the performance properties of SOI RF switches. Further, teachings on prior art SOI RF switches do not address this problem, for reasons described in more detail hereinbelow. Consequently, a need exists for a novel circuit and method for controlling charge injection in SOI RF switches.

SUMMARY

A novel circuit and method for controlling charge injection in an SOI RF switch are disclosed. The SOI RF switch may comprise a plurality of switching transistors connected in series (referred to herein as "stacked" switching transistors) implemented as a monolithic integrated circuit (IC) on an SOI substrate. In one embodiment the SOI RF switch is fabricated on an Ultra-Thin-Silicon ("UTSi") substrate, also referred to herein as "silicon on sapphire" (SOS). In another embodiment, the SOI RF switch is fabricated in silicon-on-bonded wafer technology.

In an embodiment according to the present disclosure, an SOI RF switch includes at least one stack comprising a plurality of switching transistors connected in a series circuit. Charge injection control elements are connected to receive injected charge from resistively-isolated nodes located between the switching transistors, and to convey the injected charge to one or more nodes that are not resistively-isolated. Optionally, the charge injection control elements may be connected to receive a control signal for switching the charge injection control elements between ON-states and OFF-states. In one embodiment, each switching transistor in a stack of the SOI RF switch has at least one charge injection control element operatively connected between a source node and a drain node of each switching transistor.

In one embodiment, the charge injection control elements comprise charge injection control resistors. In another embodiment, the charge injection control elements comprise charge injection control transistors connected to receive a control signal for switching the injection control transistors between and ON-state and an OFF-state. The charge injection control transistors are operated so that they are in the ON-state when the switching transistors are in an ON-state. When the switching transistors are switched from the ON-state to an OFF-state, the charge injection control transistors are switched from an ON-state to an OFF-state after a selected delay time interval, thereby allowing the injected charge to be conveyed to the least one node that is not resistively-isolated.

In one embodiment, a method for controlling charge injection includes: 1) causing charge injection to occur at resistively-isolated nodes located between the switching transistors; 2) conveying the injected charge via charge injection control elements to at least one node that is not resistively-isolated; and, 3) optionally switching the charge injection control elements from an ON-state to an OFF-state.

According to one embodiment of the method for controlling charge injection, the charge injection control elements may comprise charge injection control resistors. In another embodiment, the charge injection control elements may comprise charge injection control transistors.

BRIEF DESCRIPTION OF THE DRAWINGS

Like reference numbers and designations in the various drawings indicate like elements.

DETAILED DESCRIPTION

Throughout this description, embodiments and variations are described for the purpose of illustrating uses and implementations of the inventive concept. The illustrative description should be understood as presenting examples of the inventive concept, rather than as limiting the scope of the concept as disclosed herein.

The problems caused by charge injection in SOI RF switches may be described with reference to FIG. 1A. An SOI RF switch 100 comprises stacked switching transistors 111, 113, 115 and 117. As disclosed in commonly-assigned U.S. application Ser Nos. 10/922,135 and 10/267,531 incorporated by reference hereinabove, RF switches using stacked switching transistors have many performance advantages over prior art RF switches, such as higher RF power capability and reduced generation of harmonics in the switched RF signal. (For further information on stacked switching transistors, see commonly assigned application Ser. No. 10/922,135 filed Aug. 18, 2004, which issued Oct. 17, 2006 as U.S. Pat. No. 7,123,898, and is a continuation application of application Ser. No. 10/267,531, filed Oct. 8, 2002, which issued Oct. 12, 2004 as U.S. Pat. No. 6,804,502, entitled "SWITCH CIRCUIT AND METHOD OF SWITCHING RADIO FREQUENCY SIGNALS"; application Ser. No. 10/267,531 claimed the benefit under 35 U.S.C. § 119(e) of U.S. Provisional Application No. 60/328,353, filed Oct. 10, 2001. All of the applications and issued patents set forth in the preceding sentence are hereby incorporated by reference herein as if set forth in full.) Although four stacked switching transistors are shown in FIG. 1A, it will be apparent to persons skilled in the arts of electronic circuits that the present teachings apply to RF switches having an arbitrary plurality of stacked switching transistors.

Figure 1A:
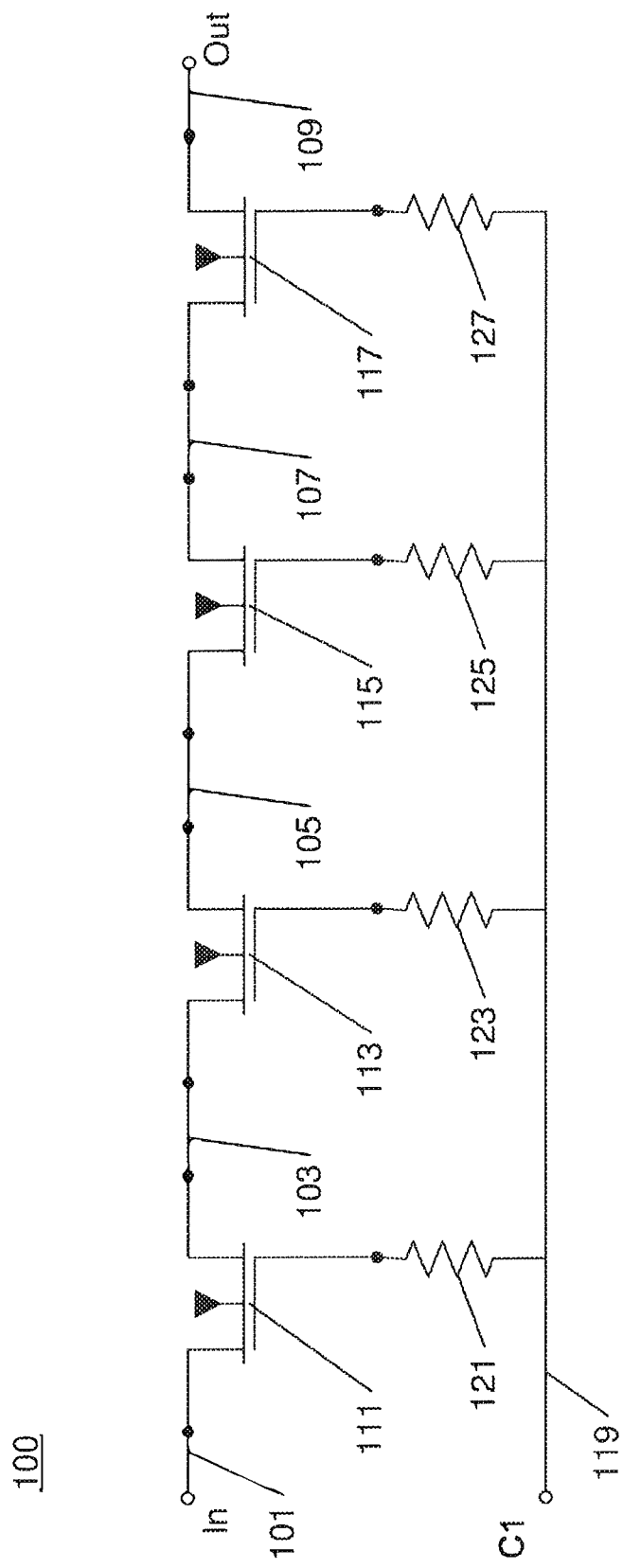
FIG. 1A schematically illustrates an SOI RF switch circuit using stacked switching transistors.

As shown in FIG. 1A, a first channel node of the switching transistor 111 may receive an input RF signal from a node 101. A second channel node of the switching transistor 111 is operatively connected through a node 103 to a first node of the switching transistor 113. A second channel node of the switching transistor 113 is operatively connected through a node 105 to a first channel node of the switching transistor 115. A second channel node of the switching transistor 115 is operatively connected through a node 107 to a first channel node of the switching transistor 117. A second channel node of the switching transistor 117 is connected to a node 109, which may output an RF signal. Typically, the nodes 101 and 109 are connected to load impedances (not shown) having resistance values to ground on the order of 50 or 75 ohms.

Gate nodes of the switching transistors 111, 113, 115 and 117 are separately connected to gate resistors 121, 123, 125 and 127, respectively. As disclosed in U.S. application Ser. Nos. 10/922,135 and 10/267,531, the gate resistors are included to enable voltage division of RF signals across the switching transistors, protect bias circuits, and prevent transmission of parasitic RF signals between the stacked switching transistors. In some embodiments, the resistance Rg of each gate resistor should be at least ten times larger than the RF impedance of the gate-to-drain capacitance Cgd of the switching transistor to which it is connected. The gate resistors 121, 123, 125 and 127 are jointly connected to a gate control line 119 to receive a gate control signal C1.

The operation and advantages of RF switches such as the SOI RF switch 100 have been previously disclosed, as for example in U.S. application Ser. Nos. 10/922,135 and 10/267,531. However, the charge injection problem and solution have not been previously disclosed. In the present example, as illustrated by FIG. 1A, charge injection may occur at the nodes 103, 105 and 107 in the following manner. For the present example, the switching transistors 111, 113, 115 and 117 comprise enhancement-mode n-channel Metal-Oxide-Semiconductor Field Effect Transistors (MOSFETs) with a threshold voltage of +0.3 V. The gate control signal C1 is varied between a voltage of +3.0 V wherein the switching transistors are ON, and a voltage of −3.0 V wherein the switching transistors are OFF.

When the gate control signal C1 changes from +3 V to −3 V, the voltage passes through the switching transistor threshold voltage +0.3 V. During this process, the switching transistors 111 and 117 will switch from ON to OFF without difficulty because the nodes 109 and 101 are connected to load resistors (not shown) and therefore have an average DC potential at approximately ground potential or 0 V. The first channel node of the switching transistor 111 and the second channel node of the switching transistor 117 will be at a DC bias voltage of approximately 0 V, and their respective gate nodes will be a voltage of −3 V. However, when the switching transistors 111 and 117 switch from ON to OFF, the nodes 103, 105 and 107 become resistively isolated, as defined hereinabove in paragraph 004. For this reason, charge injection through the gate-to-channel capacitances of the switching transistors 113 and 115 to the nodes 103, 105 and 107 will occur as the control signal C1 voltage moves from the threshold voltage of +0.3 to −3 V. The charge injection will tend to maintain the nodes 103, 105 and 107 at voltages that may be only slightly more positive than the control signal C1 voltage. This will prevent the channels of the transistors 103, 105 and 107 from achieving a highly depleted condition, which is required for proper operation of the SOI RF switch 100.

Figure 1B:
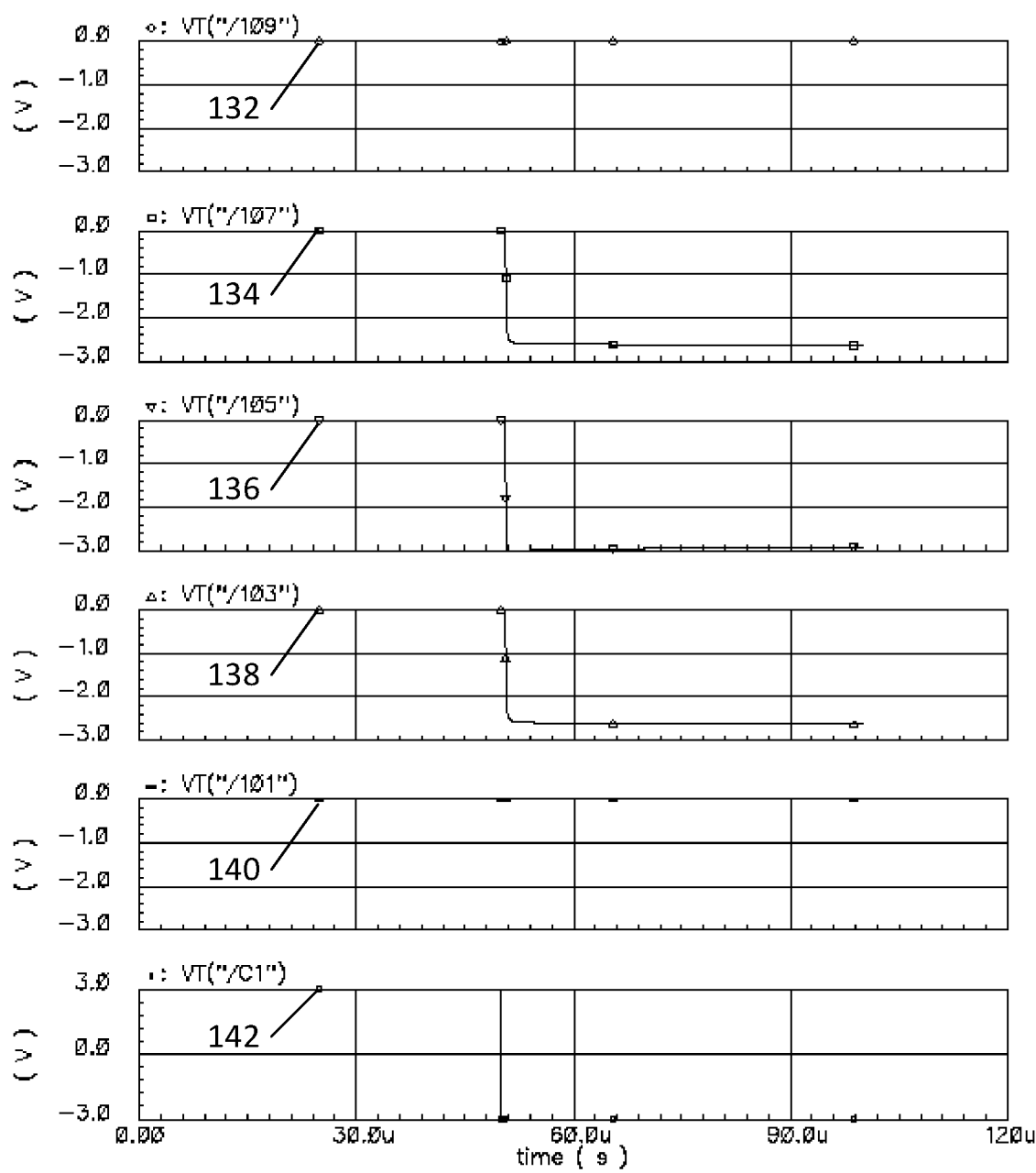
FIG. 1B illustrates the effects of charge injection in an SOI RF switch circuit using stacked switching transistors.

These effects are illustrated in FIG. 1B by simulated data for the SOI RF switch 100. When a control voltage 142 (C1) is switched from +3 V to −3 V, voltages 134, 136 and 138 on nodes 107, 105 and 103, respectively, follow the voltage 142 as described above. Voltages 132 and 140 on nodes 109 and 101, respectively, remain at 0 V because they are not resistively isolated.

Prior art teachings are not informed regarding the problem of charge injection as described above. The principal reason for this is that RF switches such as SOI RF switch 100 are typically used to switch RF signals of several volts AC amplitude. If some of the switching transistors are not in a strong OFF-state, the RF signals will cause breakdown effects in the switching transistors that are strongly turned OFF and therefore receive larger RF signal voltages. These breakdown effects remove the injected charge from the resistively-isolated nodes, thereby enabling the switches to operate after a time interval. However, the breakdown effects may have deleterious effects on the reliability of the switching transistors. Further, because the breakdown effects occur over a time interval, the performance of the RF switch is adversely affected during the time interval. In particular, during the time interval wherein the injected charge is not completely removed, the switch response becomes nonlinear, and undesirable RF harmonics may be generated by the SOI RF switch.

Figure 1C:
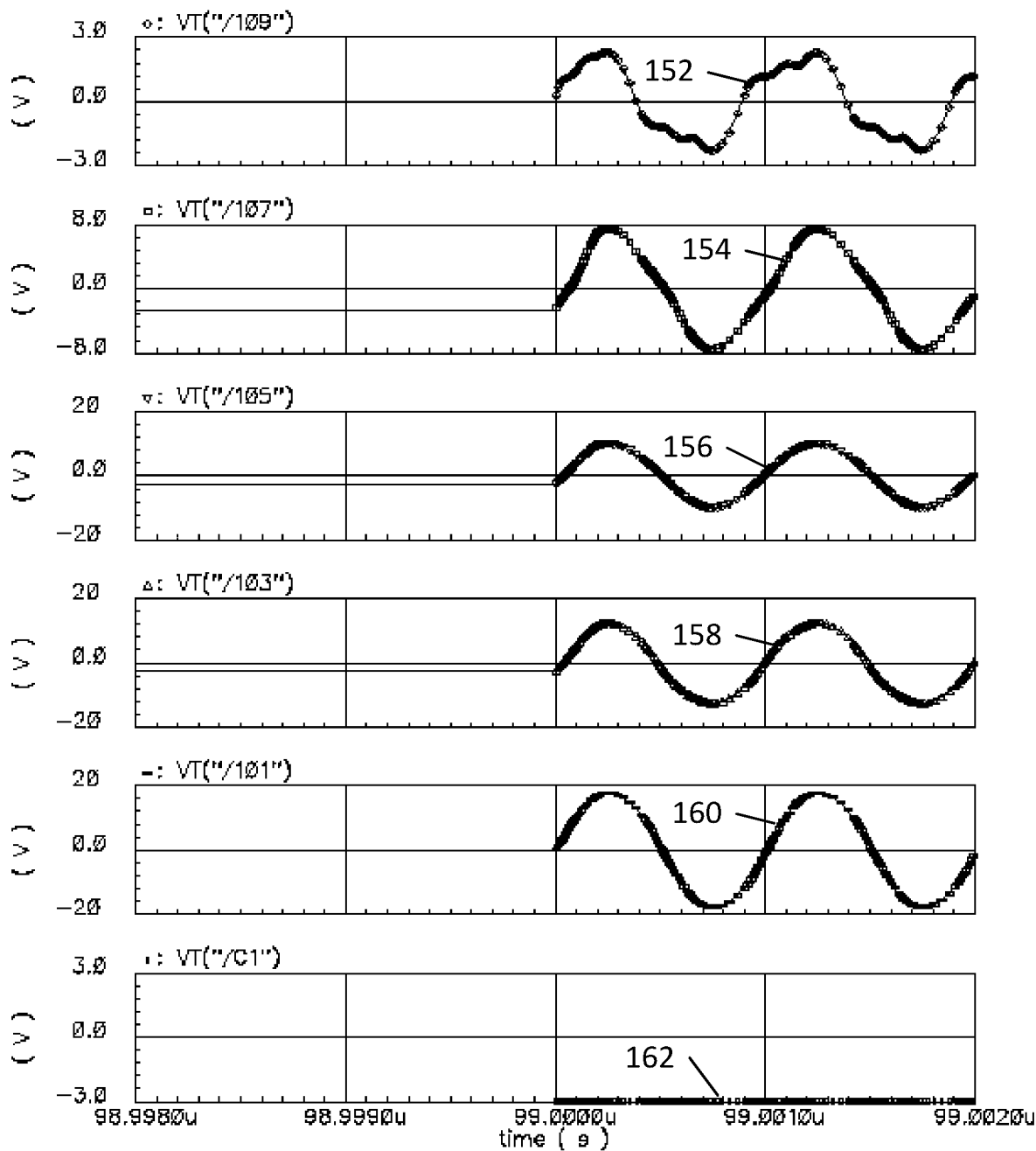
FIG. 1C illustrates simulated data for the RF switch of FIG. 1A wherein the RF switch has recently been switched from an ON-state to an OFF-state.

These deleterious effects are illustrated in FIG. 1C by simulated data for the SOI RF switch 100 that has been recently switched from the ON-state to the OFF-state. At a time 99.0000 microseconds, an RF signal 160 is applied at the node 101. RF signals 158, 156, 154 and 152 appear at nodes 103, 105, 107 and 109, respectively, due to parasitic coupling effects. Persons skilled in the electronic arts will recognize from the distorted waveforms seen in the RF signals 158, 156, 154 and 152 that significant nonlinear distortion is present during the time interval illustrated, which corresponds to a time when charge injection effects are present. These deleterious effects due to charge injection can be reduced or eliminated according to the teachings herein.

SOI RF Switch with a Charge Injection Control Circuit.

Figure 2:
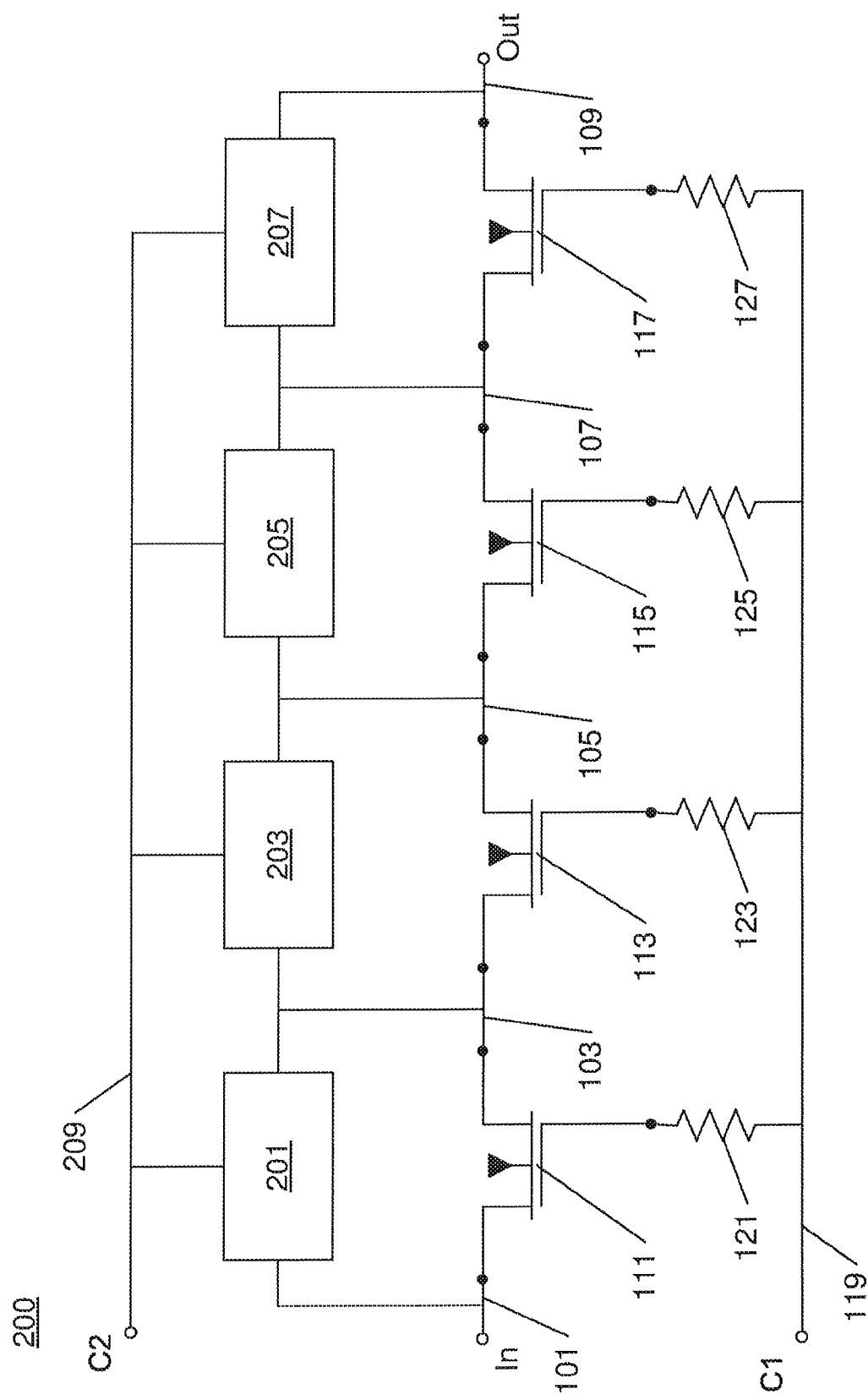
FIG. 2 schematically illustrates an embodiment according to the present disclosure, including a charge injection control circuit.

An embodiment of a charge injection control circuit to remove injected charge in an SOI RF switch is illustrated by FIG. 2.

In FIG. 2, an SOI RF switch 200 includes charge injection control elements 201, 203, 205 and 207 that comprise elements of a charge injection control circuit. A first and second channel node of the charge injection control element 201 are operatively connected to the nodes 101 and 103, respectively. A first and second channel node of the charge injection control element 203 are operatively connected to the nodes 103 and 105, respectively. A first and second channel node of the charge injection control element 205 are operatively connected to the nodes 105 and 107, respectively. A first and second channel node of the charge injection control element 207 are similarly operatively connected to the nodes 107 and 109, respectively. Optionally (e.g., as described below in reference to FIG. 4), the charge injection control elements 201, 203, 205 and 207 may be connected to a control line 209 to receive a control signal C2.

The charge injection control elements 201, 203, 205 and 207 receive injected charge from the nodes 103, 105 and 107, and selectively convey the injected charge to the nodes 101 and 109. For some embodiments, the control voltage C2 may be used to switch the charge injection control elements 201, 203, 205 and 207 between ON and OFF states (e.g., as described below in reference to FIG. 4).

For improved performance, the charge injection control elements 201, 203, 205 and 207 should be designed to have an impedance sufficiently high to prevent degradation of the RF isolation performance of the SOI RF switch 200. However, the charge injection control elements 201, 203, 205 and 207 should also have an impedance sufficiently low to effectively remove the injected charge and avoid degradation of the switching time for the SOI RF switch 200. Further, in some embodiments, the charge injection control elements 201, 203, 205 and 207 are designed so that they do not cause nonlinear behavior and RF harmonic generation. In addition, it is desirable that the charge injection control elements 201, 203, 205 and 207 do not degrade the switching time of the SOI RF switch 200. These design tradeoffs are described in more detail below in reference to FIGS. 3 and 4.

Many configurations of charge injection control elements can be used to remove injected charge from resistively-isolated nodes between switching transistors in SOI RF switches.

SOI RF Switch Circuits with Charge Injection Control Circuits Using Resistors

Figure 3:
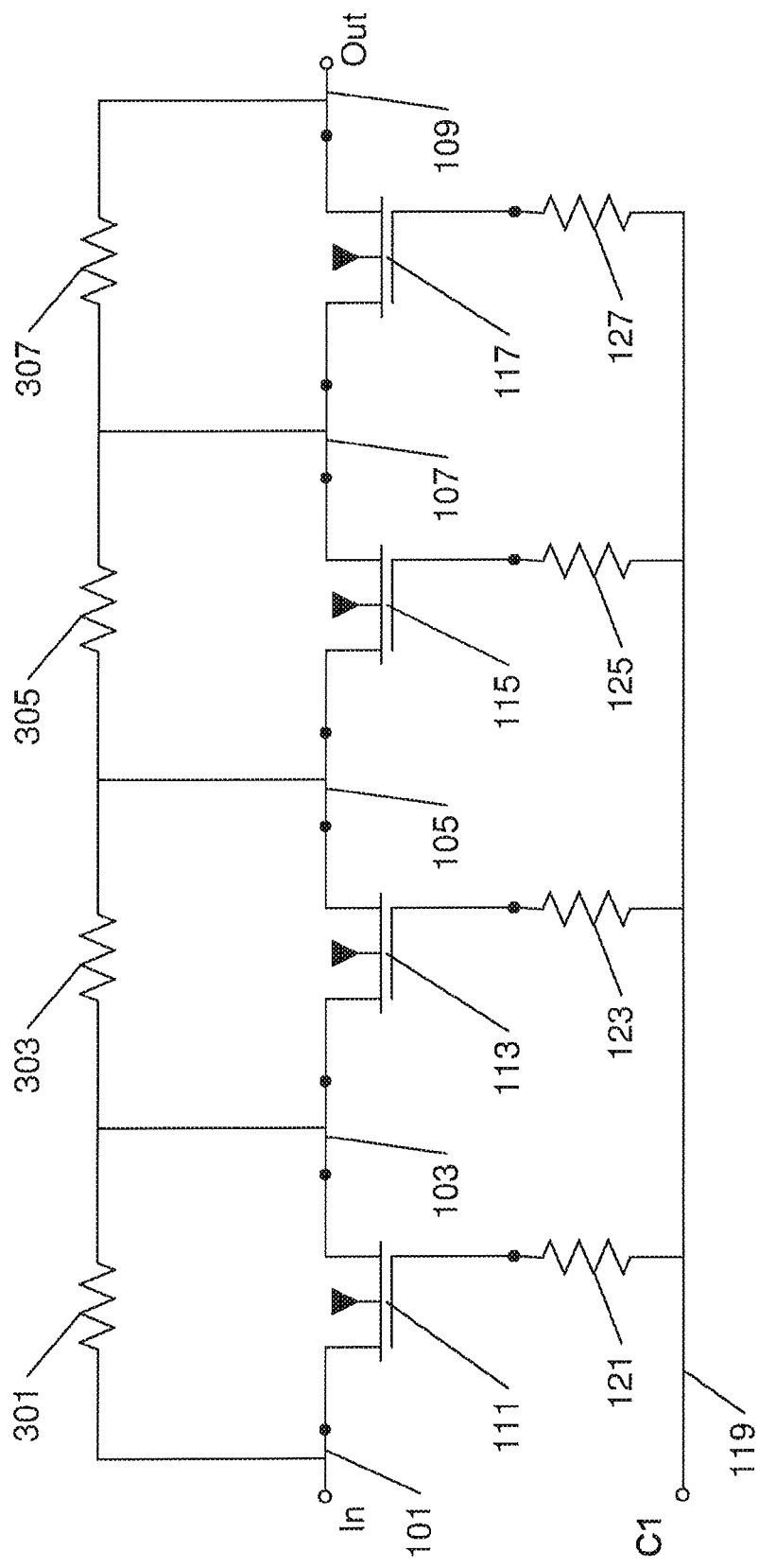
FIG. 3 shows a schematic illustration of an embodiment according to the present disclosure, using resistors in a charge injection control circuit.

An embodiment of a charge injection control circuit using resistors to remove injected charge in an SOI RF switch is illustrated in FIG. 3. In FIG. 3, an SOI RF switch 300 includes charge injection control resistors 301, 303, 305 and 307 that comprise elements of a charge injection control circuit. A first node of the charge injection control resistor 301 is operatively connected to the node 101, and a second node of the charge injection control resistor 301 is operatively connected to the node 103. Similarly, a first node of the charge injection control resistor 303 is operatively connected to the node 103, and a second node of the charge injection control resistor 303 is operatively connected to the node 105. Similarly, a first node of the charge injection control resistor 305 is operatively connected to the node 105, and a second node of the charge injection control resistor 305 is operatively connected to the node 107. Similarly, a first node of the charge injection control resistor 307 is operatively connected to the node 107, and a second node of the charge injection control resistor 307 is operatively connected to the node 109. The charge injection control resistors 301, 303, 305 and 307 receive injected charge from the nodes 103, 105 and 107, and convey the injected charge to the nodes 101 and 109.

As noted above, for improved performance, the charge injection control resistors 301, 303, 305 and 307 are designed to have a sufficiently high resistance valve to prevent degradation of the RF isolation performance of the SOI RF switch 300. However, the charge injection control resistors 301, 303, 305 and 307 should also have a low enough resistance to effectively remove the injected charge. Using circuit simulation techniques, good performance has been determined for charge injection resistors selected according to the following equation:

$$Rc = Rg/N \qquad \text{[EQUATION 1]}$$

In Equation 1, Rc is the resistance of each charge injection control resistor, Rg is the resistance of each gate resistor, and N is the number of RF switching transistors in the stack, also referred to as the "stack height". It has been determined that choosing the charge injection resistors according to EQUATION 1 provides minimal degradation to the isolation and switching time performance of the SOI RF switch. In one embodiment, SOI RF switch 300 may have gate resistors 121, 123, 125 and 127 that are each 100 K-ohm. In this embodiment, the charge injection control resistors 301, 303, 305 and 307 will each comprise 25 K-ohm resistors, because the stack height N=4 in this example. The present disclosure also encompasses use of charge injection control resistors having Rc values other than as indicated by EQUATION 1. For example, in some embodiments Rc may be selected in the range 10×Rg/N>Rc>Rg/10N.

U.S. application Ser. No. 11/484,370, filed Jul. 10, 2006, pending, incorporated by reference hereinabove, discloses using drain-to-source Rds resistors between the source and drain of a stacked SOI RF switch having an accumulated charge sink. Although the Rds resistors 802, 804, and 806 as shown in FIG. 8, of the U.S. application Ser. No. 11/484,370 have a configuration that is similar to the charge injection control resistors 301, 303, 305 and 307, their function and operation are distinct. In particular, the Rds resistors 802, 804, and 806 are included to allow removal of a DC current generated by using an accumulated charge sink, while the present disclosure provides a solution to the more general problem of charge injection in SOI RF switches that may or may not have an accumulated charge sink.

Charge Injection Control Circuit Using Transistors to Remove Injected Charge

Figure 4:
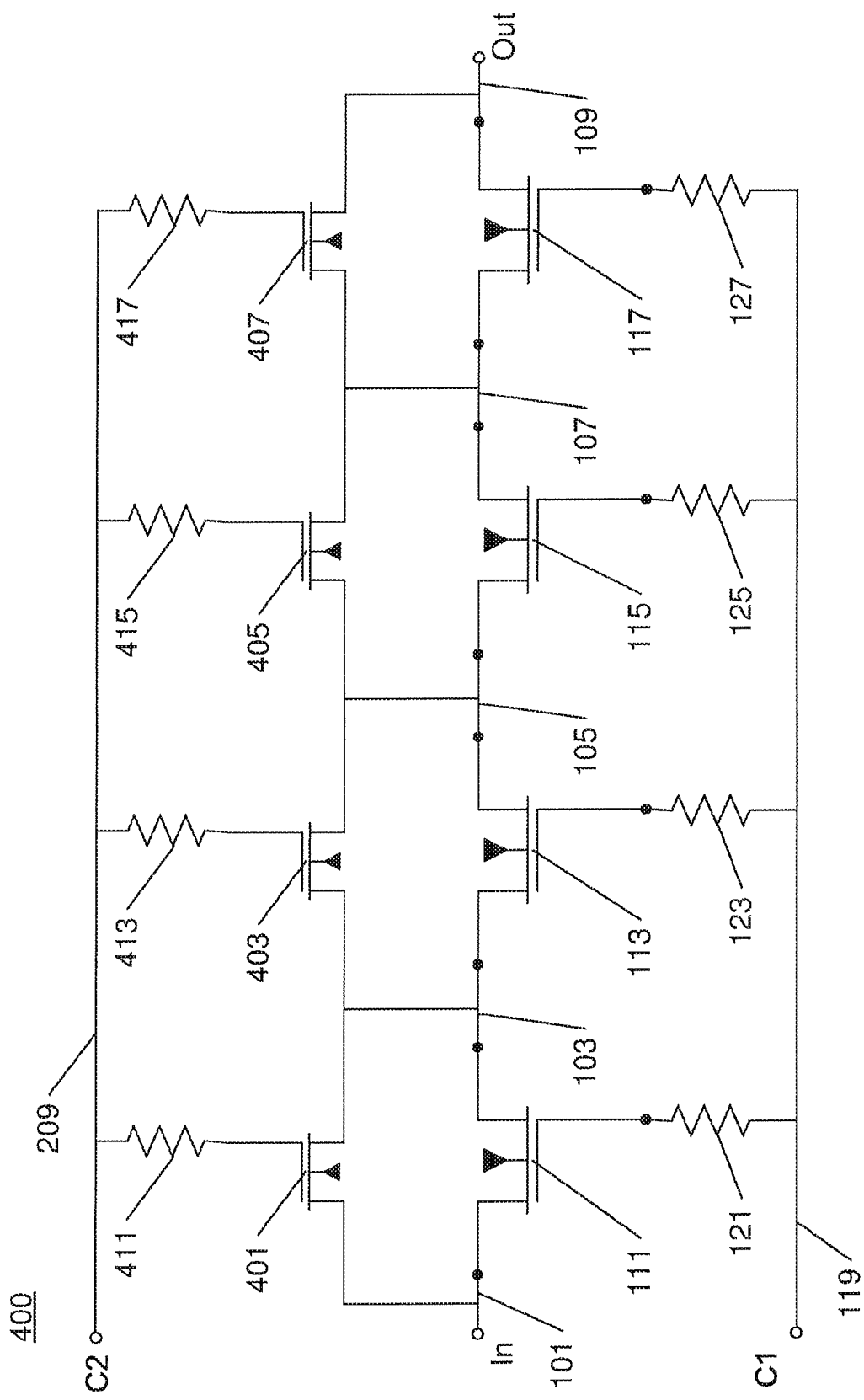
FIG. 4 shows a schematic illustration of an embodiment according to the present disclosure, using transistors in a charge injection control circuit.

An embodiment of a charge injection control circuit using transistors to remove injected charge in an SOI RF switch is illustrated by FIG. 4.

In FIG. 4 an SOI RF switch 400 includes charge injection control transistors 401, 403, 405 and 407 that comprise elements of a charge injection control circuit. A first and second channel node of the charge injection control transistor 401 are operatively connected to the nodes 101 and 103, respectively. Similarly, a first and second channel node of the charge injection control transistor 403 are operatively connected to the nodes 103 and 105, respectively. Similarly, a first and second channel node of the charge injection control transistor 405 are operatively connected to the nodes 105 and 107, respectively. Similarly, a first and second channel node of the charge injection control transistor 407 are operatively connected to the nodes 107 and 109, respectively.

The gates of the charge injection control transistors 401, 403, 405 and 407 are operatively connected to gate resistors 411, 413, 415 and 417, respectively. The gate resistors 411, 413, 415 and 417 are also connected to a control line 209 to receive a control signal C2 that is conveyed to the gates of the charge injection control transistors 401, 403, 405 and 407. The gate resistors 411, 413, 415 and 417 are included to enable voltage division of RF signals across the switching transistors, protect bias circuits, and prevent transmission of parasitic RF signals between the stacked switching transistors.

In one embodiment, in operation, the control signal C2 provides a voltage signal to maintain the charge injection control transistors 401, 403, 405 and 407 in an ON-state during time intervals in which the gate control signal C1 maintains the switching transistors 111, 113, 115 and 117 in an ON-state. For example, the transistors 401, 403, 405, 407, 111, 113, 115 and 117 may all be enhancement-mode n-channel MOSFETs with a threshold voltage of +0.1 V. The gate control signals C1 and C2 may be selected to vary between a voltage of +1.0 V to turn the transistors ON, and a voltage of −3.0 V to turn the transistors OFF.

When the gate control signal C1 transitions from +1 V to −3 V, the voltage passes through the switching transistor threshold voltage +0.1 V. If the gate control signal C2 is maintained at a voltage of +1 V for a time interval after the gate control signal C1 transitions from +1 V to −3 V, the nodes 103, 105 and 107 maintain low resistance connections to the nodes 101 and 109 via the ON-state charge injection control transistors 401, 403, 405 and 407. This low resistance connection conveys the injected charge from the nodes 103, 105 and 107 to the nodes 101 and 109, thereby controlling the charge injection process. After the switching transistors 111, 113, 115 and 117 are in the OFF-state, the charge injection control transistors 401, 403, 405 and 407 may be switched to the OFF-state by changing the gate control signal C2 from +1 V to −3 V.

In order to reduce charge injection via the charge injection control transistors 401, 403, 405 and 407 to the nodes 103, 105 and 107 that may occur when the charge injection control transistors 401, 403, 405 and 407 are switched OFF, the capacitances between the gate nodes and the channel nodes of the charge injection control transistors should be made smaller than the capacitances between the gate nodes and the channel nodes of the switching transistors. This may be accomplished by making the widths of the charge injection control transistors smaller than the widths of the switching transistors. For example, if the charge injection control transistors have a width We that is 0.1 times as large as a width Ws of the switching transistors, the charge injection magnitude will be smaller by a factor of approximately 0.1. At this level, the charge injection will be sufficiently small to not degrade performance for an SOI RF switch such the exemplary SOI RF switch 400.

Some advantages of using charge injection control transistors, rather than charge injection control resistors, are reduced switching time and improved switch isolation.

Charge Injection Control Method

Figure 5:
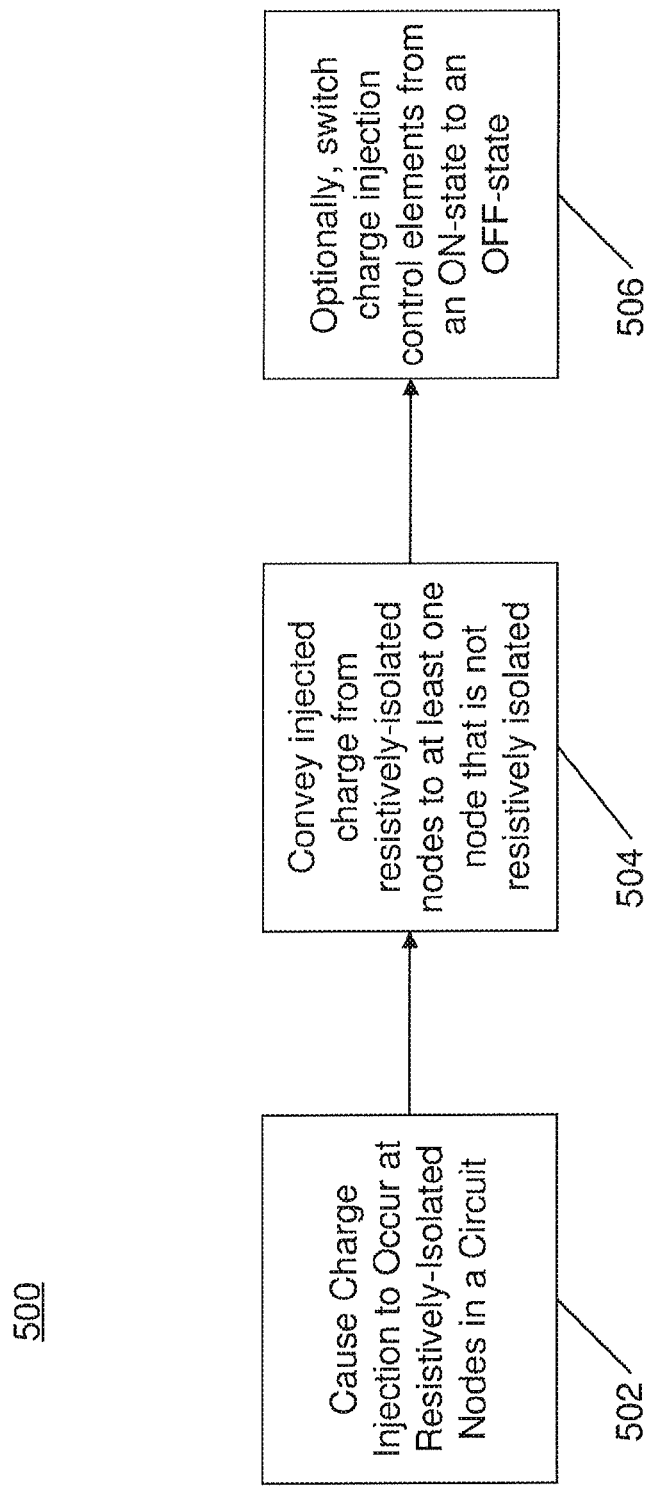
FIG. 5 is a flow chart diagram illustrating a charge injection control method.

In FIG. 5 a charge injection control method 500 is represented by a flow chart diagram. The method begins at a STEP 502, wherein charge injection is caused to occur at resistively isolated nodes of a circuit. In one embodiment, charge injection is generated in an SOI RF switch including stacked switching transistors when the RF switch is switched from an ON-state to an OFF-state. In this embodiment, the charge injection occurs at resistively-isolated nodes located between the switching transistors.

At a STEP 504, the injected charge is conveyed via charge injection control elements from the resistively-isolated nodes to at least one node that is not resistively-isolated. In one embodiment, the charge injection control elements may comprise charge injection control resistors. For this embodiment, the method stops at the STEP 504.

At an optional STEP 506, the charge injection control elements are switched from an ON-state to an OFF-state following a selected time delay interval after the switching transistors are switched from the ON-state to the OFF-state. For example, the STEP 506 is implemented in an embodiment wherein the charge injection control elements comprise charge injection control transistors.

Pulse Method for Controlling Accumulated Charge

As disclosed in U.S. application Ser. No. 11/484,370, filed Jul. 10, 2006, pending, and in U.S. application Ser. No. 11/520,912, filed Sep. 14, 2006, filed Sep. 15, 2005, both incorporated by reference hereinabove, accumulated charge can occur in MOSFET devices that are used in SOI RF switches. A MOSFET device is defined as operating within an "accumulated charge regime" when the MOSFET is biased to operate in an off-state, and when carriers having opposite polarity to the channel carriers are present in the channel region. Accumulated charge in the channel region can degrade the performance of MOSFETs used in SOI RF switches. In particular, the accumulated charge can cause harmonic generation in RF signals and degrade the gate oxide reliability of a MOSFET device.

Accumulated charge in an n-channel MOSFET results from a slow electron-hole pair generation process that occurs when a gate voltage Vg is negative with respect to a source bias voltage Vs and a drain bias voltage Vd. If a positive voltage pulse above a threshold voltage Vth is applied to the gate terminal of the MOSFET, a conducting channel comprising electrons is formed in the body of the MOSFET, and the accumulated charge is dissipated due to drift and recombination. When the gate voltage Vg returns to the negative bias level present prior to the application of the positive voltage pulse, the accumulated charge regenerates in a time period having a time scale that is typically in the millisecond range or longer. Consequently, the accumulated charge in the MOSFET may be controlled by applying a series of positive voltage pulses to the gate terminal. In one example, the pulse rate may be selected by observing harmonic generation in an applied RF signal, and selecting a pulse rate sufficiently high to prevent the harmonic generation from exceeding a desired level.

As a practical effect of applying the pulse method of controlling accumulated charge in an SOI RF switch, charge injection will occur each time the switching transistors are switched from an ON-state to an OFF-state. Consequently, the teachings of the present disclosure for controlling charge injection are also useful when used in conjunction with SOI RF switch systems employing the pulse method for controlling accumulated charge.

Embodiments Using Accumulated Charge Control (ACC) Switching Transistors

Embodiments according to the present teachings may, in some embodiments, use switching transistors (e.g., the switching transistors 111, 113, 115 and 117 of FIGS. 1A, 2, 3 and 4) having an accumulated charge sink (ACS) 610, as shown in FIGS. 6A-6D, and as described in greater detail in U.S. application Ser. No. 11/484,370, filed Jul. 10, 2006, pending, incorporated by reference hereinabove. For example, the switching transistors 111, 113, 115, and 117 (see FIGS. 3-4 and associated description above) may, in some embodiments, comprise accumulated charge control (ACC) transistors described in the above-incorporated application Ser. No. 11/484,370, filed Jul. 10, 2006, and shown in FIGS. 6A-6D. In another embodiment, the switching transistors 111, 113, 115, and 117 may comprise ACC transistors operated according to the pulse method for controlling accumulated charge, as described above and as described in greater detail in the above-incorporated application Ser. No. 11/520,912, filed Sep. 14, 2006.

As shown in FIGS. 6A-6D, in an improved ACC SOI NMOSFET 600, a gate terminal 602 is electrically coupled to a gate 601, a source terminal 604 is electrically coupled to a source 603, and a drain terminal 606 is electrically coupled to a drain 605. Finally, the ACC MOSFET 600 includes an ACS terminal 608 that is electrically coupled to the ACS 610.

The ACC SOI NMOSFET 600 may be operated using various techniques and implemented in various circuits in order to control accumulated charge present in the FET when it is operating in an accumulated charge regime. For example, in one exemplary embodiment as shown in FIG. 6B, the gate and ACS terminals, 602 and 608, respectively, are electrically coupled together. In one embodiment of the simplified circuit shown in FIG. 6B, the source and drain bias voltages applied to the terminals 604 and 606, respectively, may be zero. If the gate bias voltage (Vg) applied to the gate terminal 602 is sufficiently negative with respect to the source and drain bias voltages (Vs and Vd, respectively) applied to the terminals 604 and 606, and with respect to the threshold voltage $V_{th}$, (for example, if $V_{th}$ is approximately zero, and if Vg is more negative than approximately −1 V) the ACC NMOSFET 600 operates in the accumulated charge regime. When the MOSFET operates in this regime, accumulated charge (holes) may accumulate in the NMOSFET 600.

Advantageously, the accumulated charge can be removed via the ACS terminal 608 by connecting the ACS terminal 608 to the gate terminal 602 as shown in FIG. 6B. This configuration ensures that when the FET 600 is operated in the OFF-state, it is held in the correct bias region to effectively remove or otherwise control the accumulated charge. As shown in FIG. 6B, connecting the ACS terminal 608 to the gate ensures that the same bias voltages are applied to both the gate (Vg) and the ACS 610 ($V_{ACS}$). The accumulated charge is thereby removed from the SOI NMOSFET 600 via the ACS terminal 608.

In other exemplary embodiments, as described with reference to FIG. 6C, for example, Vs and Vd may comprise nonzero bias voltages. According to these examples, Vg must be sufficiently negative to both Vs and Vd in order for Vg to be sufficiently negative to $V_{th}$ to turn the NMOSFET 600 OFF (i.e., operate the NMOSFET 600 in the OFF-state). When so biased, as described above, the NMOSFET 600 may enter the accumulated charge regime. For this example, the voltage $V_{ACS}$ may also be selected to be equal to Vg by connecting the ACS terminal 608 to the gate terminal 602, thereby conveying the accumulated charge from the ACC NMOSFET, as described above.

Figure 6A:
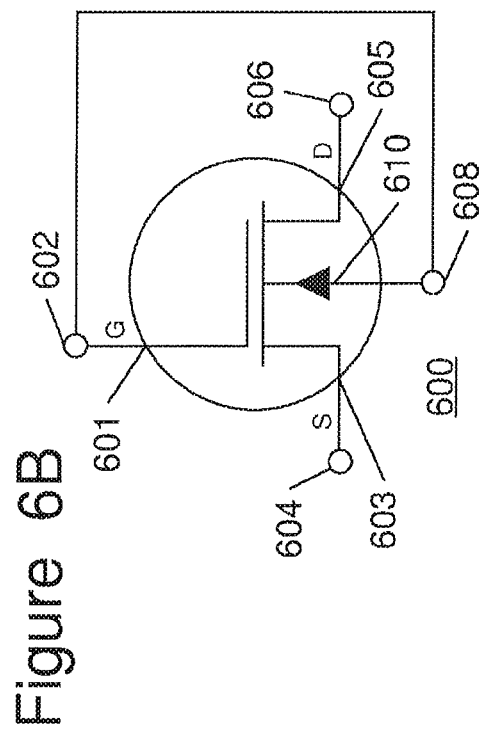
FIG. 6A is a simplified schematic of an improved SOI NMOSFET adapted to control accumulated charge embodied as a four terminal device.
Figure 6C:
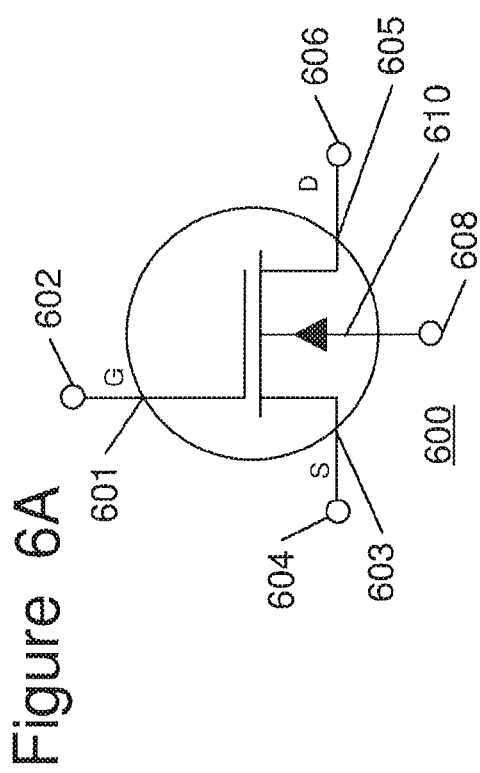
FIG. 6C is a simplified schematic of an improved SOI NMOSFET adapted to control accumulated charge, embodied as a four terminal device, wherein an accumulated charge sink (ACS) terminal is coupled to a gate terminal via a diode.
Figure 6B:
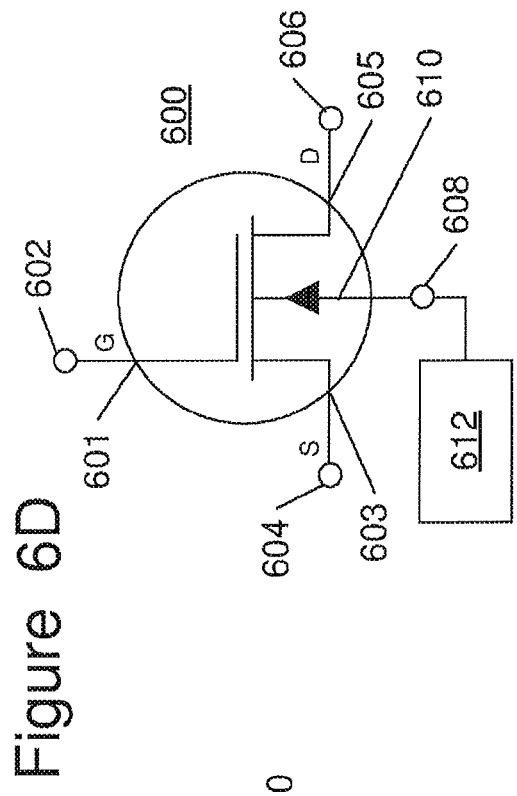
FIG. 6B is a simplified schematic of an improved SOI NMOSFET adapted to control accumulated charge, embodied as a four terminal device, wherein an accumulated charge sink (ACS) terminal is coupled to a gate terminal.

Another exemplary simplified circuit using the improved ACC SOI NMOSFET 600 is shown in FIG. 6C. As shown in FIG. 6C, in this embodiment, the ACS terminal 608 may be electrically coupled to a diode 610, and the diode 610 may, in turn, be coupled to the gate terminal 602. This embodiment may be used to prevent a positive current flow into the ACS 610 caused by a positive Vg-to-Vs (or, equivalently, Vgs, where Vgs=Vg−Vs) bias voltage, as may occur, for example, when the SOI NMOSFET 300 is biased into an ON-state condition.

As with the device shown in FIG. 6B, when biased OFF, the ACS terminal 608 voltage $V_{ACS}$ comprises the gate voltage plus a voltage drop across the diode 610. At very low ACS terminal 610 current levels, the voltage drop across the diode 610 typically also is very low (e.g., <<500 mV, for example, for a typical threshold diode).

When the SOI NMOSFET 600 is biased in an ON-state condition, the diode 610 is reverse-biased, thereby preventing the flow of positive current into the source and drain regions. The reverse-biased configuration reduces power consumption and improves linearity of the device. The circuit shown in FIG. 6C therefore works well to remove the accumulated charge when the FET is in the OFF-state and is operated in the accumulated charge regime. It also permits almost any positive voltage to be applied to the gate voltage Vg. This, in turn, allows the ACC MOSFET to effectively remove accumulated charge when the device operates in the OFF-state, yet assume the characteristics of a floating body device when the device operates in the ON-state.

With the exception of the diode 610 used to prevent the flow of positive current into the ACS terminal 608, exemplary operation of the simplified circuit shown in FIG. 6C is the same as the operation of the circuit described above with reference to FIG. 6B.

Figure 6D:
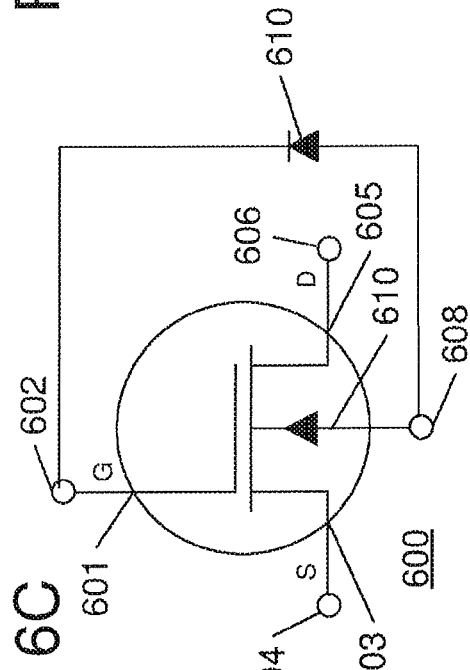
FIG. 6D is a simplified schematic of an improved SOI NMOSFET adapted to control accumulated charge, embodied as a four terminal device, wherein an accumulated charge sink (ACS) terminal is coupled to a control circuit.

In yet another embodiment, the ACS terminal 608 may be coupled to a control circuit 612 as illustrated in the simplified circuit of FIG. 6D. The control circuit 612 may provide a selectable ACS bias voltage $V_{ACS}$ that selectively controls the accumulated charge.

Method of Fabrication

With varying performance results, RF switches have heretofore been implemented in different component technologies, including bulk complementary-metal-oxide-semiconductor (CMOS) and gallium-arsenide (GaAs) technologies. In fact, most high-performance high-frequency switches use GaAs technology.

Although GaAs RF switch implementations offer improved performance characteristics relative to bulk CMOS, the technology has several disadvantages. For example, GaAs technology exhibits relatively low yields of properly functioning integrated circuits. GaAs RF switches tend to be relatively expensive to design and manufacture. In addition, although GaAs switches exhibit improved insertion loss characteristics as described above, they may have low frequency limitations due to slow states present in the GaAs substrate. The technology also does not lend itself to high levels of integration, which requires that digital control circuitry associated with the RF switch be implemented "off chip" from the switch. The low power control circuitry associated with the switch has proven difficult to integrate. This is disadvantageous as it both increases the overall system cost or manufacture, size and complexity, as well as reducing system throughput speeds.

In one embodiment of the present disclosure, the exemplary circuits described hereinabove are implemented using a fully insulating substrate silicon-on-insulator (SOI) technology. More specifically, the MOSFET transistors of the present disclosure are implemented using "Ultra-Thin-Silicon (UTSi)" (also referred to herein as "ultrathin silicon-on-sapphire") technology. In accordance with UTSi manufacturing methods, the transistors used to implement the inventive RF switch are formed in an extremely thin layer of silicon in an insulating sapphire wafer. The fully insulating sapphire substrate enhances the performance characteristics of the inventive RF switch by reducing the deleterious substrate coupling effects associated with non-insulating and partially insulating substrates. For example, improvements in insertion loss are realized by lowering the transistor ON-state resistances and by reducing parasitic substrate conductances and capacitances. In addition, switch isolation is improved using the fully insulating substrates provided by UTSi technology. Owing to the fully insulating nature of silicon-on-sapphire technology, the parasitic capacitance between the nodes of the RF switches are greatly reduced as compared with bulk CMOS and other traditional integrated circuit manufacturing technologies.

Silicon on Insulator RF Integrated Circuits

As is well known, SOI has been used in the implementation of high performance microelectronic devices, primarily in applications requiring radiation hardness and high speed operation. SOI technologies include, for example, SIMOX, bonded wafers having a thin silicon layer bonded to an insulating layer, and silicon-on-sapphire. In order to achieve the desired RF switch performance characteristics described hereinabove, in one embodiment, the inventive RF switch is fabricated on a sapphire substrate.

Fabrication of devices on an insulating substrate requires that an effective method for forming silicon CMOS devices on the insulating substrate be used. The advantages of using a composite substrate comprising a monocrystalline semiconductor layer, such as silicon, epitaxially deposited on a supporting insulating substrate, such as sapphire, are well-recognized, and can be realized by employing as the substrate an insulating material, such as sapphire ($Al_2O_3$), spinel, or other known highly insulating materials, and providing that the conduction path of any inter-device leakage current must pass through the substrate.

An "ideal" SOI wafer can be defined to include a completely monocrystalline, defect-free silicon layer of sufficient thickness to accommodate the fabrication of active devices therein. The silicon layer would be adjacent to an insulating substrate and would have a minimum of crystal lattice discontinuities at the silicon-insulator interface. Early attempts to fabricate this "ideal" silicon-on-insulator wafer were frustrated by a number of significant problems, which can be summarized as (1) substantial incursion of contaminants into the epitaxially deposited silicon layer, especially the p-dopant aluminum, as a consequence of the high temperatures used in the initial epitaxial silicon deposition and the subsequent annealing of the silicon layer to reduce defects therein; and (2) poor crystalline quality of the epitaxial silicon layers when the problematic high temperatures were avoided or worked around through various implanting, annealing, and/or re-growth schemes.

It has been found that the high quality silicon films suitable for demanding device applications can be fabricated on sapphire substrates by a method that involves epitaxial deposition of a silicon layer on a sapphire substrate, low temperature ion implant to form a buried amorphous region in the silicon layer, and annealing the composite at temperatures below about 950 degrees C.

Examples of and methods for making such silicon-on-sapphire devices are described in U.S. Pat. No. 5,416,043 ("Minimum charge FET fabricated on an ultrathin silicon on sapphire wafer"); U.S. Pat. No. 5,492,857 ("High-frequency wireless communication system on a single ultrathin silicon on sapphire chip"); U.S. Pat. No. 5,572,040 ("High-frequency wireless communication system on a single ultrathin silicon on sapphire chip"); U.S. Pat. No. 5,596,205 ("High-frequency wireless communication system on a single ultrathin silicon on sapphire chip"); U.S. Pat. No. 5,600,169 ("Minimum charge FET fabricated on an ultrathin silicon on sapphire wafer"); U.S. Pat. No. 5,663,570 ("High-frequency wireless communication system on a single ultrathin silicon on sapphire chip"); U.S. Pat. No. 5,861,336 ("High-frequency wireless communication system on a single ultrathin silicon on sapphire chip"); U.S. Pat. No. 5,863,823 ("Self-aligned edge control in silicon on insulator"); U.S. Pat. No. 5,883,396 ("High-frequency wireless communication system on a single ultrathin silicon on sapphire chip"); U.S. Pat. No. 5,895,957 ("Minimum charge FET fabricated on an ultrathin silicon on sapphire wafer"); U.S. Pat. No. 5,920,233 ("Phase locked loop including a sampling circuit for reducing spurious side bands"); U.S. Pat. No. 5,930,638 ("Method of making a low parasitic resistor on ultrathin silicon on insulator"); U.S. Pat. No. 5,973,363 ("CMOS circuitry with shortened P-channel length on ultrathin silicon on insulator"); U.S. Pat. No. 5,973,382 ("Capacitor on ultrathin semiconductor on insulator"); and U.S. Pat. No. 6,057,555 ("High-frequency wireless communication system on a single ultrathin silicon on sapphire chip"). All of these referenced patents are incorporated herein in their entirety for their teachings on ultrathin silicon-on-sapphire integrated circuit design and fabrication.

Using the methods described in the patents referenced above, electronic devices can be formed in an extremely thin layer of silicon on an insulating synthetic sapphire wafer. The thickness of the silicon layer is typically less than 150 nm. Such an "ultrathin" silicon layer maximizes the advantages of the insulating sapphire substrate and allows the integration of multiple functions on a single integrated circuit. Traditional transistor isolation wells required for thick silicon are unnecessary, simplifying transistor processing and increasing circuit density. To distinguish these above-referenced methods and devices from earlier thick-silicon embodiments, they are herein referred to collectively as "ultrathin silicon-on-sapphire."

In some embodiments of the present disclosure, the MOS transistors may be formed in ultrathin silicon-on-sapphire wafers by the methods disclosed in U.S. Pat. Nos. 5,416,043; 5,492,857; 5,572,040; 5,596,205; 5,600,169; 5,663,570; 5,861,336; 5,863,823; 5,883,396; 5,895,957; 5,920,233; 5,930,638; 5,973,363; 5,973,382; and 6,057,555. However, other known methods of fabricating silicon-on-sapphire integrated circuits can be used without departing from the spirit or scope of the present teachings.

A number of embodiments of the present inventive concept have been described. Nevertheless, it will be understood that various modifications may be made without departing from the scope of the inventive teachings. For example, it should be understood that many types of switch circuits (e.g., single-pole single-throw, single-pole double-throw, double-throw-pole double-throw, etc.) may be used according to the present teachings. In another example, it should be noted that although embodiments having SOI RF switches have been used herein for exemplary purposes, persons skilled in the electronic arts will understand that the present teachings may be applied to many other types of switching circuits having isolated nodes wherein charge injection may occur.

Accordingly, it is to be understood that the inventive concept is not to be limited by the specific illustrated embodiments, but only by the scope of the appended claims. The description may provide examples of similar features as are recited in the claims, but it should not be assumed that such similar features are identical to those in the claims unless such identity is essential to comprehend the scope of the claim. In some instances the intended distinction between claim features and description features is underscored by using slightly different terminology.

What is claimed is:

1. A switch circuit comprising:
a plurality of series-coupled transistors configured to selectively couple a signal from an input of the plurality of series-coupled transistors to an output of the plurality of series-coupled transistors based on a switch control signal applied to each transistor of the plurality of series-coupled transistors, wherein a transistor of the plurality of series-coupled transistors is configured to operate in an off state or an on state based on the switch control signal applied to the transistor, wherein the transistor comprises a gate and an accumulated charge sink (ACS) coupled to the gate, and wherein the ACS is configured to control accumulated charge in the transistor when the transistor is operated in the off state; and
a plurality of charge injection control resistors, wherein each charge injection control resistor of the plurality of charge injection control resistors has at least one end coupled to a node between two transistors of the plurality of series-coupled transistors to control injected charge at the node.

2. The switch circuit of claim 1, wherein, for each of the plurality of charge injection control resistors, the at least one end is coupled to the node to control the injected charge at the node by receiving the injected charge from the node and conveying the injected charge to the input and/or the output of the plurality of series-coupled transistors.

3. The switch circuit of claim 1, wherein each transistor of the plurality of series-coupled transistors comprises a metal-oxide-semiconductor field effect transistor (MOSFET).

4. The switch circuit of claim 1, further comprising a resistor having a resistance Rg and coupled to one of the plurality of series-coupled transistors, wherein the plurality of series-coupled transistors comprises a plurality of N transistors, and wherein an impedance of at least one charge injection control resistor of the plurality of charge injection control resistors is in the range between $10 R_g/N$ and $R_g/10N$.

5. The switch circuit of claim 1, wherein at least one charge injection control resistor of the plurality of charge injection control resistors has an impedance sufficiently low to control the injected charge at the node to which the at least one end of the at least one charge injection control resistor is coupled and/or avoid degradation of a switching time associated with the switch circuit.

6. The switch circuit of claim 5, wherein the impedance of the at least one charge injection control resistor is sufficiently high to prevent degradation of isolation performance associated with the switch circuit.

7. The switch circuit of claim 5, further comprising a resistor having a resistance Rg and coupled to one of the plurality of series-coupled transistors.

8. The switch circuit of claim 7, wherein the plurality of series-coupled transistors comprises a plurality of N transistors, and wherein the impedance of the at least one charge injection control resistor is in the range between 10 Rg/N and Rg/10N.

9. The switch circuit of claim 7, wherein the resistance Rg of the resistor is at least ten times larger than an impedance of a gate-to-drain capacitance associated with the one of the plurality of series-coupled transistors.

10. The switch circuit of claim 7, wherein the impedance of the at least one charge injection control resistor is smaller than the resistance Rg of the resistor.

11. The switch circuit of claim 7, wherein the plurality of series-coupled transistors comprises a plurality of N transistors, and wherein the impedance of the at least one charge injection control resistor is greater than or equal to about Rg/N.

12. The switch circuit of claim 7, wherein the plurality of series-coupled transistors comprises a plurality of N transistors, and wherein the impedance of the at least one charge injection control resistor is approximately equal to Rg/N.

13. The switch circuit of claim 1, further comprising a diode coupled to the gate and the ACS, wherein the diode is configured to selectively convey accumulated charge from the ACS to the gate.

14. A method comprising:
selectively coupling a signal from an input of a plurality of series-coupled transistors to an output of the plurality of series-coupled transistors based on a switch control signal applied to each transistor of the plurality of series-coupled transistors, wherein a transistor of the plurality of series-coupled transistors selectively operates in an off state or an on state based on the switch control signal applied to the transistor, wherein the transistor comprises a gate and an accumulated charge sink (ACS) coupled to the gate;
controlling, by a plurality of charge injection control resistors, injected charge at nodes of the plurality of series-coupled transistors, wherein each of the nodes is between two transistors of the plurality of series-coupled transistors; and
controlling, by the ACS, accumulated charge in the transistor when the transistor is operated in the off state.

15. The method of claim 14, wherein the controlling the injected charge comprises receiving, by the plurality of charge injection control resistors, the injected charge from the nodes and conveying the injected charge to the input and/or the output of the plurality of series-coupled transistors.

16. The method of claim 14, wherein each transistor of the plurality of series-coupled transistors comprises a metal-oxide-semiconductor field effect transistor (MOSFET).

17. The method of claim 14, wherein at least one charge injection control resistor of the plurality of charge injection control resistors has an impedance sufficiently low to control the injected charge at one or more of the nodes and/or sufficiently high to prevent degradation of isolation performance associated with the plurality of series-coupled transistors and the plurality of charge injection control resistors.

18. The method of claim 14, wherein the plurality of series-coupled transistors comprises a plurality of N transistors, wherein a resistor has a resistance Rg and is coupled to one of the plurality of series-coupled transistors, and wherein an impedance of at least one charge injection control resistor of the plurality of charge injection control resistors is in the range between 10 Rg/N and Rg/10N.

19. The method of claim 14, wherein the controlling the accumulated charge in the transistor comprises applying a series of voltage pulses to the gate of the transistor.

20. The method of claim 14, wherein the controlling the accumulated charge comprises conveying the accumulated charge from the ACS of the transistor to the gate of the transistor.

* * * * *

UNITED STATES PATENT AND TRADEMARK OFFICE
CERTIFICATE OF CORRECTION

| | |
|---|---|
| PATENT NO. | : 12,348,221 B2 |
| APPLICATION NO. | : 18/344631 |
| DATED | : July 1, 2025 |
| INVENTOR(S) | : Alexander Dribinsky et al. |

Page 1 of 2

It is certified that error appears in the above-identified patent and that said Letters Patent is hereby corrected as shown below:

In the Specification

In the CROSS-REFERENCE TO RELATED UTILITY AND PROVISIONAL APPLICATIONS-CLAIMS OF PRIORITY:

Column 1, Lines 9-10, change "U.S. patent application Ser. No." to --U.S. Patent Application No.--.

Column 1, Lines 12-13, change "U.S. patent application Ser. No." to --U.S. Patent Application No.--.

Column 1, Lines 13-14, change "U.S. patent application Ser. No." to --U.S. Patent Application No.--.

Column 1, Line 16, change "U.S. patent application Ser. No." to --U.S. Patent Application No.--.

Column 1, Lines 17-18, change "U.S. patent application Ser. No." to --U.S. Patent Application No.--.

Column 1, Line 20, change "U.S. patent application Ser. No." to --U.S. Patent Application No.--.

Column 1, Lines 21-22, change "U.S. patent application Ser. No." to --U.S. Patent Application No.--.

Column 1, Line 24, change "U.S. patent application Ser. No." to --U.S. Patent Application No.--.

Column 1, Line 25, change "U.S. patent application Ser. No." to --U.S. Patent Application No.--.

Column 1, Line 28, change "U.S. patent application Ser. No." to --U.S. Patent Application No.--.

Column 1, Line 29, change "U.S. patent application Ser. No." to --U.S. Patent Application No.--.

Column 1, Line 32, change "U.S. patent application Ser. No." to --U.S. Patent Application No.--.

Column 1, Lines 33-34, change "U.S. patent application Ser. No." to --U.S. Patent Application No.--.

Signed and Sealed this
Ninth Day of September, 2025

Coke Morgan Stewart
*Acting Director of the United States Patent and Trademark Office*

CERTIFICATE OF CORRECTION (continued)
U.S. Pat. No. 12,348,221 B2

Column 1, Lines 36-37, change "U.S. patent application Ser. No." to --U.S. Patent Application No.--.

Column 1, Line 41, change "U.S. patent application Ser. No." to --U.S. Patent Application No.--.

Column 1, Line 42, change "U.S. patent application Ser. No." to --U.S. Patent Application No.--.

Column 1, Lines 45-46, change "U.S. patent application Ser. No." to --U.S. Patent Application No.--.

Column 1, Line 50, change "U.S. patent application Ser. No." to --U.S. Patent Application No.--.

Column 1, Line 51, change "U.S. patent application Ser. No." to --U.S. Patent Application No.--.

Column 1, Lines 54-55, change "U.S. patent application Ser. No." to --U.S. Patent Application No.--.

In the DETAILED DESCRIPTION:

Column 4, Line 32, change "U.S. application Ser Nos." to --U.S. Application Nos.--.

Column 4, Lines 38-39, change "application Ser. No." to --Application No.--.

Column 4, Line 41, change "of application Ser. No." to --of Application No.--.

Column 4, Lines 44-45, change "application Ser. No." to --Application No.--.

Column 5, Lines 5-6, change "U.S. application Ser. Nos." to --U.S. Application Nos.--.

Column 7, Line 61, change "U.S. application Ser. No." to --U.S. Application No.--.

Column 7, Line 66, change "U.S. application Ser. No." to --U.S. Application No.--.

Column 9, Line 8, change "width We that" to --width Wc that --.

Column 9, Line 41, change "U.S. application Ser. No." to --U.S. Application No.--.

Column 9, Line 42, change "U.S. application Ser. No." to --U.S. Application No.--.

Column 10, Line 22, change "U.S. application Ser. No." to --U.S. Application No.--.

Column 10, Lines 27-28, change "application Ser. No." to --Application No.--.

Column 10, Line 33, change "application Ser. No." to --Application No.--.